(12) United States Patent
Jang et al.

(10) Patent No.: US 11,223,443 B2
(45) Date of Patent: *Jan. 11, 2022

(54) METHOD AND APPARATUS OF RATE-MATCHING FOR COMMUNICATION AND BROADCASTING SYSTEMS

(71) Applicant: Samsung Electronics Co., Ltd., Suwon-si (KR)

(72) Inventors: Min Jang, Seongnam-si (KR); Seokki Ahn, Suwon-si (KR); Seho Myung, Seoul (KR); Hongsil Jeong, Suwon-si (KR); Kyungjoong Kim, Suwon-si (KR); Jaeyoel Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/906,660

(22) Filed: Jun. 19, 2020

(65) Prior Publication Data

US 2020/0322083 A1 Oct. 8, 2020

Related U.S. Application Data

(63) Continuation of application No. 16/011,021, filed on Jun. 18, 2018, now Pat. No. 10,742,350.

(30) Foreign Application Priority Data

Jun. 19, 2017 (KR) .................. 10-2017-0077564
Aug. 1, 2017 (KR) .................. 10-2017-0097843
Aug. 24, 2017 (KR) .................. 10-2017-0107573

(51) Int. Cl.
*H04L 1/00* (2006.01)
*H03M 13/13* (2006.01)
*H03M 13/00* (2006.01)

(52) U.S. Cl.
CPC .......... *H04L 1/0013* (2013.01); *H03M 13/13* (2013.01); *H03M 13/6362* (2013.01);
(Continued)

(58) Field of Classification Search
CPC ... H04L 1/0013; H04L 1/0071; H04L 1/0057; H04L 1/0067; H04L 1/0041;
(Continued)

(56) References Cited

U.S. PATENT DOCUMENTS 10,742,350 B2 * 8/2020 Jang .................. H04L 1/0068
2015/0333769 A1 11/2015 Jeong et al.
(Continued)

FOREIGN PATENT DOCUMENTS

WO 2018/175557 A1 9/2018

OTHER PUBLICATIONS

ZTE: "Rate Matching Scheme for Polar Codes", R1-1713235, Aug. 17, 2017.
(Continued)

*Primary Examiner* — Guerrier Merant
(74) *Attorney, Agent, or Firm* — Jefferson IP Law, LLP

(57) ABSTRACT

A communication method and system for converging a 5th-generation (5G) communication system for supporting higher data rates beyond a 4th-generation (4G) system with a technology for internet of things (IoT) are provided. The disclosure may be applied to intelligent services based on the 5G communication technology and the IoT-related technology, such as smart home, smart building, smart city, smart car, connected car, health care, digital education, smart retail, security and safety services. The method and apparatus for polar encoding and rate-matching are disclosed.

23 Claims, 19 Drawing Sheets

(52) U.S. Cl.
CPC .......... *H04L 1/0041* (2013.01); *H04L 1/0057* (2013.01); *H04L 1/0067* (2013.01); *H04L 1/0071* (2013.01)

(58) Field of Classification Search
CPC ... H04L 1/0009; H04L 1/0068; H04L 1/0058; H03M 13/13; H03M 13/6362; H03M 13/27; H03M 13/2778; H03M 13/2906; H03M 13/6356; H04B 1/38
See application file for complete search history.

(56) References Cited

U.S. PATENT DOCUMENTS

| | | |
|---|---|---|
| 2016/0248547 A1 | 8/2016 | Shen et al. |
| 2016/0269050 A1 | 9/2016 | Shen et al. |
| 2017/0005753 A1 | 1/2017 | Shen et al. |
| 2018/0026663 A1 | 1/2018 | Wu et al. |
| 2018/0226995 A1 | 8/2018 | Wu et al. |
| 2019/0181983 A1 | 6/2019 | Ye et al. |

OTHER PUBLICATIONS

Samsung: "Design of Unified Rate-Matching for Polar Codes", R1-1710750, Jun. 20, 2017.
Mediatek Inc: Polar rate-matching design and performance, R1-1713705, Aug. 17, 2017.
European Search Report dated May 19, 2020, issued in European Application No. 18820113.1-1210.
Samsung,'Design of a Nested polar code sequences', R1-1708051, 3GPP TSG RAN WG1 Meeting #89, Hangzhou, P R. China, May 6, 2017.
Qualcomm Incorporated,'Rate-matching scheme for polar codes and performance evaluation', R1-1708647, 3GPP TSG RAN WG1 Meeting #89, Hangzhou, P R. China, May 7, 2017.
International Search Report dated Sep. 18, 2018, issued in International Application No. PCT/KR2018/006868.

* cited by examiner

METHOD AND APPARATUS OF RATE-MATCHING FOR COMMUNICATION AND BROADCASTING SYSTEMS

CROSS-REFERENCE TO RELATED APPLICATION(S)

This application is a continuation of prior application Ser. No. 16/011,021 filed on Jun. 18, 2018, which is based on and claims priority under 35 U.S.C. § 119 of a Korean patent application number 10-2017-0077564, filed on Jun. 19, 2017, in the Korean Intellectual Property Office, of a Korean patent application number 10-2017-0097843, filed on Aug. 1, 2017, in the Korean Intellectual Property Office, and of a Korean patent application number 10-2017-0107573, filed on Aug. 24, 2017, in the Korean Intellectual Property Office, the disclosure of each of which is incorporated by reference herein in its entirety.

BACKGROUND

1. Field

The disclosure relates to error-correcting codes for correcting or restoring an error or loss when the error or loss occurs or is likely to occur due to various causes such as noise or interference in a process of transmitting or storing data. More particularly, the disclosure relates to a method, implementation, and apparatus for rate-matching of polar codes. The disclosure is available in various fields and can be effectively utilized in rate-matching of polar codes used for mobile communication systems such as global system for mobile communications (GSM), wideband code division multiple access (WCDMA), long term evolution (LTE), and 5th generation-new radio access technology (5G-NR).

2. Description of Related Art

To meet the demand for wireless data traffic having increased since deployment of 4th generation (4G) communication systems, efforts have been made to develop an improved 5G or pre-5G communication system. Therefore, the 5G or pre-5G communication system is also called a 'beyond 4G network' or a 'post LTE system'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems.

In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like.

In the 5G system, hybrid frequency shift keying (FSK) and quadrature amplitude modulation (QAM) modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the Internet of things (IoT) where distributed entities, such as things, exchange and process information without human intervention. The Internet of everything (IoE), which is a combination of the IoT technology and the big data processing technology through connection with a cloud server, has emerged. As technology elements, such as "sensing technology", "wired/wireless communication and network infrastructure", "service interface technology", and "Security technology" have been demanded for IoT implementation, a sensor network, a machine-to-machine (M2M) communication, machine type communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing information technology (IT) and various industrial applications.

In line with this, various attempts have been made to apply 5G communication systems to IoT networks. For example, technologies such as a sensor network, machine type communication (MTC), and machine-to-machine (M2M) communication may be implemented by beamforming, MIMO, and array antennas. Application of a cloud radio access network (RAN) as the above-described big data processing technology may also be considered to be as an example of convergence between the 5G technology and the IoT technology.

Generally, when data is transmitted or received between a transmitter and a receiver in a communication system, data errors may occur due to noise existing in a communication channel. An error-correcting coding scheme is a coding scheme designed to correct an error generated by a communication channel at a receiver. These error-correcting codes are also referred to as channel coding. An error-correcting coding technique is a technique of adding a redundant bit to data to be transmitted and then transmitting the data.

There are various schemes for the error-correcting coding technique. For example, a convolutional coding scheme, a turbo coding scheme, a low-density parity-check (LDPC) coding scheme, and a polar code scheme are known in the art. Among them, polar codes are the first codes which are theoretically proven to achieve point-to-point channel capacity by using channel polarization phenomena. The polar codes allow a code design optimized for each channel or code rate with density evolution, Gaussian approximation (GA), reciprocal channel approximation (RCA), and the like.

Meanwhile, the 5G mobile communication technology, which has been recently proposed as the next generation mobile communication system, mainly refers to the following three scenarios: an enhanced mobile broadband (eMBB) scenario, an ultra-reliable and low latency communication (URLLC) scenario, and a massive MTC (mMTC) scenario. The error-correcting codes for supporting such scenarios should also support various code rates with stable performance.

However, until now, a scheme of satisfying all of the above scenarios without increasing the complexity of memory has been yet unavailable. Accordingly, it is necessary to provide such a coding scheme.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a rate-matching operation with stable performance in encoding and decoding systems for polar codes. Particularly, various embodiments of the disclosure achieve excellent performance in a long-term evolution (LTE) or 5th generation-new radio access technology (5G-NR) communication system when performing rate-matching according to a method of interleaving encoded bits in an appropriate order, storing a resultant bit sequence in a circular buffer, and then extracting bits from the buffer. Also, various embodiments of the disclosure achieve excellent performance in all cases where puncturing, shortening, and repetition occur as a result of rate-matching through the above operations.

Additional aspects will be set forth in part in the description which follows and, in part, will be apparent from the description, or may be learned by practice of the presented embodiments.

In accordance with an aspect of the disclosure, a method for transmitting information using a polar code at an apparatus is provided. The method includes identifying a first bit sequence, identifying a second bit sequence generated by encoding the first bit sequence with the polar code, dividing the second bit sequence into a predetermined number of sub-blocks, and identifying a third bit sequence, based on a result of interleaving the divided sub-blocks based on a first pattern.

In accordance with another aspect of the disclosure, an apparatus for transmitting information using a polar code is provided. The apparatus includes a transceiver and at least one processor associated with the transceiver. The at least one processor is configured to identify a first bit sequence, identify a second bit sequence generated by encoding the first bit sequence with the polar code, divide the second bit sequence into a predetermined number of sub-blocks, and identify a third bit sequence, based on a result of interleaving the divided sub-blocks based on a first pattern.

In accordance with another aspect of the disclosure, a method for receiving information using a polar code at an apparatus is provided. The method includes receiving at least one bit sequence and identifying information bits, based on the received at least one bit sequence, generating a second bit sequence by encoding a first bit sequence with the polar code, dividing the second bit sequence into a predetermined number of sub-blocks, identifying a third bit sequence based on a result of interleaving the divided sub-blocks based on a first pattern, and generating the received at least one bit sequence based on the third bit sequence.

In accordance with another aspect of the disclosure, an apparatus for receiving information using a polar code is provided. The apparatus includes a transceiver and at least one processor associated with the transceiver. The at least one processor is configured to receive at least one bit sequence, identify information bits, based on the received at least one bit sequence, generate a second bit sequence by encoding a first bit sequence with the polar code, divide the second bit sequence into a predetermined number of sub-blocks, identify a third bit sequence based on a result of interleaving the divided sub-blocks based on a first pattern, and generate the received at least one bit sequence based on the third bit sequence.

According to various embodiments of the disclosure, a polar code rate-matching method that includes selecting a mother code, selecting a puncturing, shortening, or repetition technique, configuring an interleaver, and operating a circular buffer can achieve excellent and stable performance in communication and broadcasting systems using polar codes. In addition, according to various embodiments of the disclosure, the polar code rate-matching method can simplify a system operation by using a unified interleaver and a circular buffer operation regardless of puncturing, shortening, or repetition.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
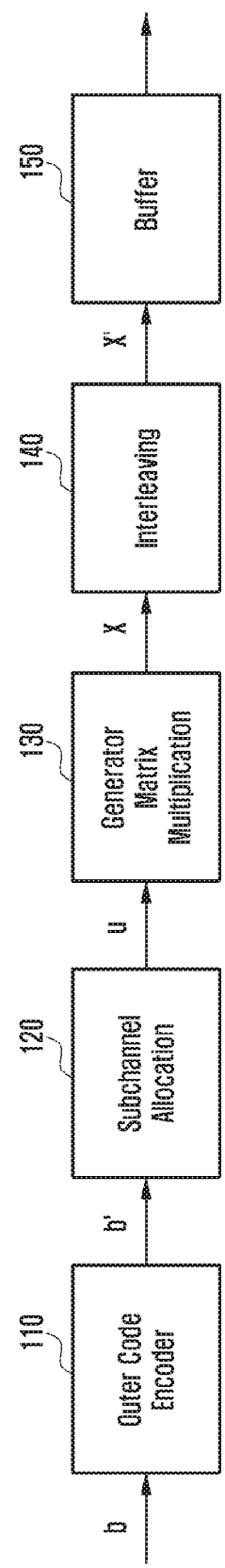
FIG. 1 is a block diagram illustrating a process of polar encoding and rate-matching according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the following description of various embodiments, descriptions of techniques that are well known in the art and not directly related to the disclosure are omitted. This is to clearly convey the subject matter of the disclosure by omitting any unnecessary explanation.

For the same reason, some elements in the drawings are exaggerated, omitted, or schematically illustrated. Also, the size of each element does not entirely reflect the actual size. In the drawings, the same or corresponding elements are denoted by the same reference numerals.

The advantages and features of the disclosure and the manner of achieving them will become apparent with reference to the various embodiments described in detail below and with reference to the accompanying drawings. The disclosure may, however, be embodied in many different forms and should not be construed as being limited to the various embodiments set forth herein. Rather, these embodiments are provided so that this disclosure will be thorough and complete and will fully convey the scope of the disclosure to those skilled in the art. To fully disclose the scope of the disclosure to those skilled in the art, the disclosure is only defined by the scope of claims.

It will be understood that each block of the flowchart illustrations, and combinations of blocks in the flowchart illustrations, may be implemented by computer program instructions. These computer program instructions may be provided to a processor of a general purpose computer, special purpose computer, or other programmable data processing apparatus to produce a machine, such that the instructions, which are executed via the processor of the computer or other programmable data processing apparatus, generate means for implementing the functions specified in the flowchart block or blocks. These computer program instructions may also be stored in a computer usable or computer-readable memory that may direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operations to be performed on the computer or other programmable apparatus to produce a computer implemented process such that the instructions that are executed on the computer or other programmable apparatus provide operations for implementing the functions specified in the flowchart block or blocks.

In addition, each block of the flowchart illustrations may represent a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

The term "unit", as used herein, may refer to a software or hardware component or device, such as a field programmable gate array (FPGA) or application specific integrated circuit (ASIC), which performs certain tasks. A unit may be configured to reside on an addressable storage medium and configured to execute on one or more processors. Thus, a module or unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units may be combined into fewer components and units or further separated into additional components and modules. In addition, the components and units may be implemented to operate one or more central processing units (CPUs) in a device or a secure multimedia card.

Now, various embodiments of the disclosure will be described in detail with reference to the accompanying drawings.

A polar code is an error-correcting code proposed by E. Arikan in 2008 and the first code which is proven to achieve the channel capacity (i.e., data transmission limit) in all binary discrete memoryless channels (B-DMCs) while having low encoding/complexity performance. Compared to other channel capacity-approaching codes such as a turbo code and a low-density parity-check (LDPC) code, the polar code has advantages in error-correcting performance and decoding complexity when short-length codes are transmitted. Therefore, in 2017, the polar code has been determined to be used for transmission of short-length control information in 3rd generation partnership project (3GPP) NR standardization for 5th generation (5G) mobile communication.

FIG. 1 shows an encoding process for a polar code according to an embodiment of the disclosure.

Referring to FIG. 1, a polar encoding method is disclosed.

In this embodiment, the number of information bits to be transmitted in an encoding process is K, and the number of codeword bits transmitted through a channel after encoding is M. In addition, the number of mother polar code bits of a polar code is N.

1) Information Bit Generation

An information bit sequence $b=\{b_0, b_1, \ldots, b_{K-1}\}$ to be transmitted is given.

2) Outer Code

At operation 110, the information bit sequence b is encoded into an outer code for performance enhancement. The outer code used is an error-detecting code such as a cyclic redundancy check (CRC) code or an error-correcting code such as a Bose-Chaudhuri-Hocquenghem (BCH) code or a single parity check code. The length of a parity generated by the outer code is denoted by $K_{outer}$, and a bit sequence resulting from outer coding is denoted by $b'=\{b'_0, b'_1, \ldots, b'_{K+K_{outer}-1}\}$. The outer coding is not an essential operation, and thus, when the outer coding is not considered, $K_{outer}=0$, and $b'=b$.

3) Sub-Channel Allocation

At operation 120, for polar encoding, the bit sequence b' is mapped to a bit sequence $u=\{u_0, u_1, \ldots, u_{N-1}\}$ having a length of N. The length N that indicates the size of the mother polar code is a power of 2 and is determined by a preset criterion. The mother polar code is a codeword before shortening or puncturing and will be further described below in a generator matrix multiplication. The letter u indicates an input bit sequence of polar encoding, and respective bits of u may be interpreted as if passing through sub-channels of different qualities by channel polarization. Because of this feature, a process of mapping b' to u is referred to as a sub-channel allocation process. Generally, the sub-channel allocation process of a polar code is composed of three operations, as follows.

A. First, the position of a sub-channel incapable of carrying information by puncturing or shortening after encoding is determined. That is, indexes of bits to which the outer coding bits are not mapped by puncturing or shortening are determined among bits of the bit sequence u. The puncturing of the polar code refers to not transmitting a part of a mother code bit sequence generated through encoding by a transmitter. Because a codeword bit is not transmitted even though generated, a receiver cannot know probability information about the codeword bit and thus may set a received value or log-likelihood ratio (LLR) value to zero. In addition, the shortening of the polar code refers to fixing a part of an encoder input bit sequence to zero so that a part of codeword bits generated through encoding becomes zero. The transmitter does not transmit a codeword bit that always becomes zero according to the result of encoding. Because of knowing that the codeword bit has the value of zero even though it is not received, the receiver sets a received value or LLR value for this bit to a very large value indicating a bit value of zero. In this shortening process, a bit shortened at an encoding input end and a corresponding bit at an output end do not necessarily have a bit value of zero, and any value that satisfies an encoding equation of a polar code can be used. However, for convenience of implementation, this is usually fixed to zero. If the number of bits punctured or shortened after encoding is denoted by $N_p$, $N_p$ bits in the bit sequence u will pass through an incapable sub-channel or shortened sub-channel. The incapable sub-channel occurs in case of puncturing, and the shortened sub-channel occurs in case of shortening. The position of the incapable/shortened sub-channel is determined by the position of a bit punctured or shortened in the encoded result. That is, indexes of bits to which the outer coding bits are not mapped are determined among bits of the polar encoder input bit sequence u in consideration of the punctured or shortened bits.

B. The respective bits of the input bit sequence b' are mapped to the remaining bits of u. The bit positions in the sequence u to which the bits of b' will be mapped are determined by the channel capacity of the sub-channel through which each bit of the sequence u will pass. That is, the b' is mapped to be transmitted on the sub-channel having the largest channel capacity among the sub-channels of the sequence u. Used for this is a sequence in which sub-channel indexes of the sequence u are arranged in order of channel capacity. This is referred to as a polar code sequence. The polar code sequence may be stored in transmitter/receiver memories or obtained by a specific operation at each transmission/reception.

C. Finally remaining bits of the sequence u are referred to as frozen bits. Although information can be transmitted as a result of the above-described operation, the bits of the sequence u passing through sub-channels having low channel capacity becomes the frozen bits. The frozen bits are set to values promised by the transmitter and receiver, being usually fixed to zero if there is no specific purpose.

4) Generator Matrix Multiplication

At operation 130, the bit sequence u having a length of N is multiplied by an N×N generator matrix G of the polar code to generate a bit sequence x having a length of N. The bit sequence x is referred to as a mother code of the polar code. When the polar code was proposed by Arikan, the generator matrix G was defined as follows.

$$G = B_N F^{\otimes \log_2 N} \qquad \text{Equation 1}$$

In the above Equation, $$F = \begin{bmatrix} 1 & 0 \\ 1 & 1 \end{bmatrix},$$

and superscript ⊗n operation denotes n times of Kronecker power. For example, $$F^{\otimes 2} = \begin{bmatrix} F & 0 \\ F & F \end{bmatrix}, \text{ and } F^{\otimes 3} = \begin{bmatrix} F^{\otimes 2} & 0 \\ F^{\otimes 2} & F^{\otimes 2} \end{bmatrix}.$$

In addition, $B_N$ is a bit-reversal permutation matrix having a size of N×N. For example, $\{a_0, a_1, a_2, a_3, a_4, a_5, a_6, a_7\}$ and $B_8$ are multiplied to obtain $\{a_0, a_1, a_2, a_3, a_4, a_5, a_6, a_7\}$. However, in recent documents and systems including 5G-NR, a simple generator matrix except $B_N$ is considered, as follows.

$$G = F^{\otimes \log_2 N} \qquad \text{Equation 2}$$

Hereinafter, unless otherwise noted, it is assumed that the generator matrix is defined as $G=F^{\otimes \log_2 N}$. The description based on this assumption may be easily applied to the polar code using a generator matrix defined as $G=B_N F^{\otimes \log_2 N}$ based on a bit-reversal permutation operation.

5) Interleaving and Rate-Matching

At operation 140, the N-length bit sequence x generated through the generator matrix multiplication is interleaved for efficient rate-matching. At operation 150, the interleaved bit sequence is stored in a buffer having a size of N. In a mobile communication system such as long-term evolution (LTE) or 5G-NR, a virtual circular buffer is generally assumed. The interleaved bit sequence is sequentially stored in the virtual circular buffer, and therefrom M bits are sequentially loaded and transmitted. If M is smaller than N, N–M bits may be punctured in the reverse order of being stored in the virtual circular buffer or be shortened in the stored order. If M is greater than N, M–N bits are repeated in the order of being stored in the virtual circular buffer. The interleaver should be designed to obtain stable performance even in case of puncturing, shortening, and repetition.

The interleaver for rate-matching should be appropriately designed to meet the characteristics of the polar code. Some of codeword bits may be punctured, shortened, or repeated by the rate-matching, and thus a change occurs in a channel undergone by bits of an x vector at a decoder of the polar code. In case of puncturing, the corresponding bit is not transmitted, and thus this bit may be regarded as having undergone a very degraded channel. In case of shortening, the value of the corresponding bit is known exactly, and thus this bit may be regarded as having undergone a very good channel. In case of repetition, soft-combining is performed by receiving probability information about the corresponding bit twice or more, and thus this bit may be regarded as having undergone a relatively good channel in comparison with a non-repeated bit. Because such a change of a channel undergone by bits of an x vector significantly affects the performance of the polar codes, it is necessary to appropriately select the positions of punctured, shortened, and repeated bits. The bit interleaver performs this function.

Figure 2:
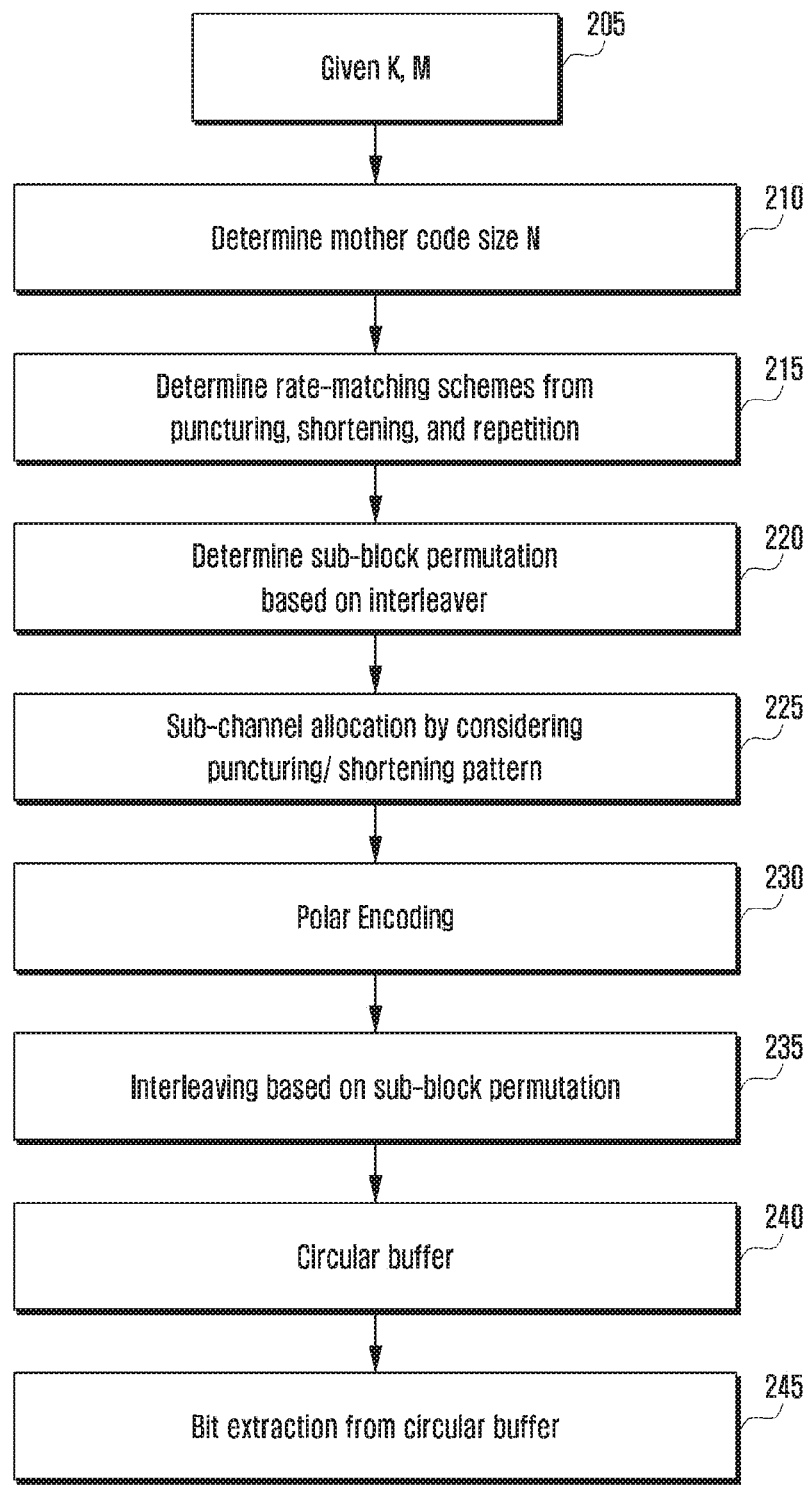
FIG. 2 is a flow diagram illustrating a process of polar encoding and rate-matching according to an embodiment of the disclosure.

FIG. 2 conceptually shows the operation of a transmitter considering rate-matching according to an embodiment of the disclosure. Similarly, although not shown, a receiver may perform a corresponding operation to configure a decoder in consideration of rate-matching.

Referring to FIG. 2, disclosed is the operation of a transmitter considering rate-matching according to an embodiment of the disclosure.

First, at operation 205, the length K of bits to be transmitted and the length M of codeword bits to be transmitted through a channel are given.

At operation 210, the transmitter determines the size N of a mother code to be used for polar encoding.

At operation 215, based on the above parameters N, K, and M, and a predetermined criterion, the transmitter determines which rate-matching operation from among puncturing, shortening, and repetition will be performed.

If it is determined to perform the puncturing or shortening operation, the transmitter determines at operation 220 a sub-channel incapable of being selected for transmission of information from among sub-channels as described above. At this time, the sub-channel incapable of being selected is determined in consideration of interleaving and rate-matching operations to be performed subsequently. Specifically, in an embodiment, all bits may be divided into sub-blocks in consideration of the puncturing or shortening operation, and this may be performed in consideration of the interleaving operation.

At operation 225, the transmitter performs a sub-channel allocation for information bits to be transmitted.

At operation 230, the transmitter performs polar encoding.

At operation 235, based on a predetermined scheme, the transmitter interleaves a bit sequence obtained as a result of the encoding.

At operation 240, the transmitter stores the interleaved bit sequence in a buffer.

At operation 245, the transmitter loads, from this buffer, M bits to be transmitted through a channel. Thereafter, these bits are transmitted through the channel after channel interleaving, modulation, and the like are performed. Hereinafter, these operations will be described respectively.

Figure 3:
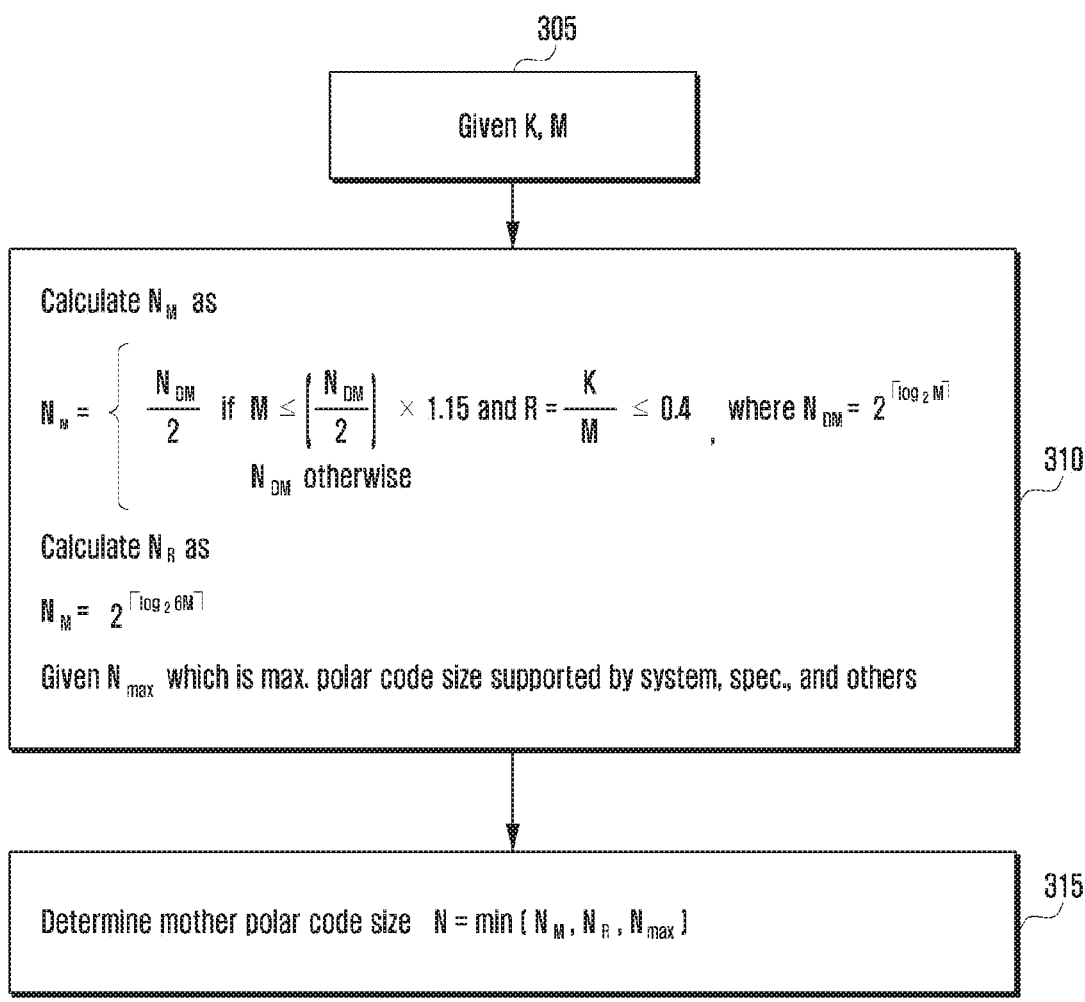
FIG. 3 is a diagram illustrating a process of determining a mother code size of a polar code according to an embodiment of the disclosure.

FIG. 3 shows a process of obtaining the mother code size N of the polar code from the given parameters K and M according to an embodiment of the disclosure.

Referring to FIG. 3, shown is a method for determining the mother code size N, based on the given parameters K and M.

At operation 305, the length K of bits to be transmitted and the length M of codeword bits to be transmitted through a channel are given.

At operation 310, values of $N_M$, $N_R$, and $N_{max}$ are calculated. To calculate $N_M$, the smallest power of 2, greater than M, $N_{DM}=2^{\lceil \log_2 M \rceil}$ is calculated first. Then, if $$M \leq \left(\frac{N_{DM}}{2}\right) \times \beta \text{ and } \frac{K}{M} \leq R_a,$$

$N_M$ is calculated as $N_{DM}/2$, and if not, $N_M$ is calculated as $N_{DM}$. In one embodiment of the disclosure, considering $\beta=1.15$ and $R_a=0.4$, an appropriate mother code size may be selected. Another parameter $N_R$ is calculated as $N_R=2^{\lceil \log_2(M/R_b) \rceil}$, and $R_b=\frac{1}{6}$ is considered in one embodiment of the disclosure. The parameter $N_{max}$ is the size of the maximum polar code that can be supported by a system.

At operation 315, based on the above calculated values, the mother code size N of the polar code to be used for encoding and decoding with respect to K and M is determined as the smallest value among the calculated values of $N_M$, $N_R$, and $N_{max}$.

Figure 4:
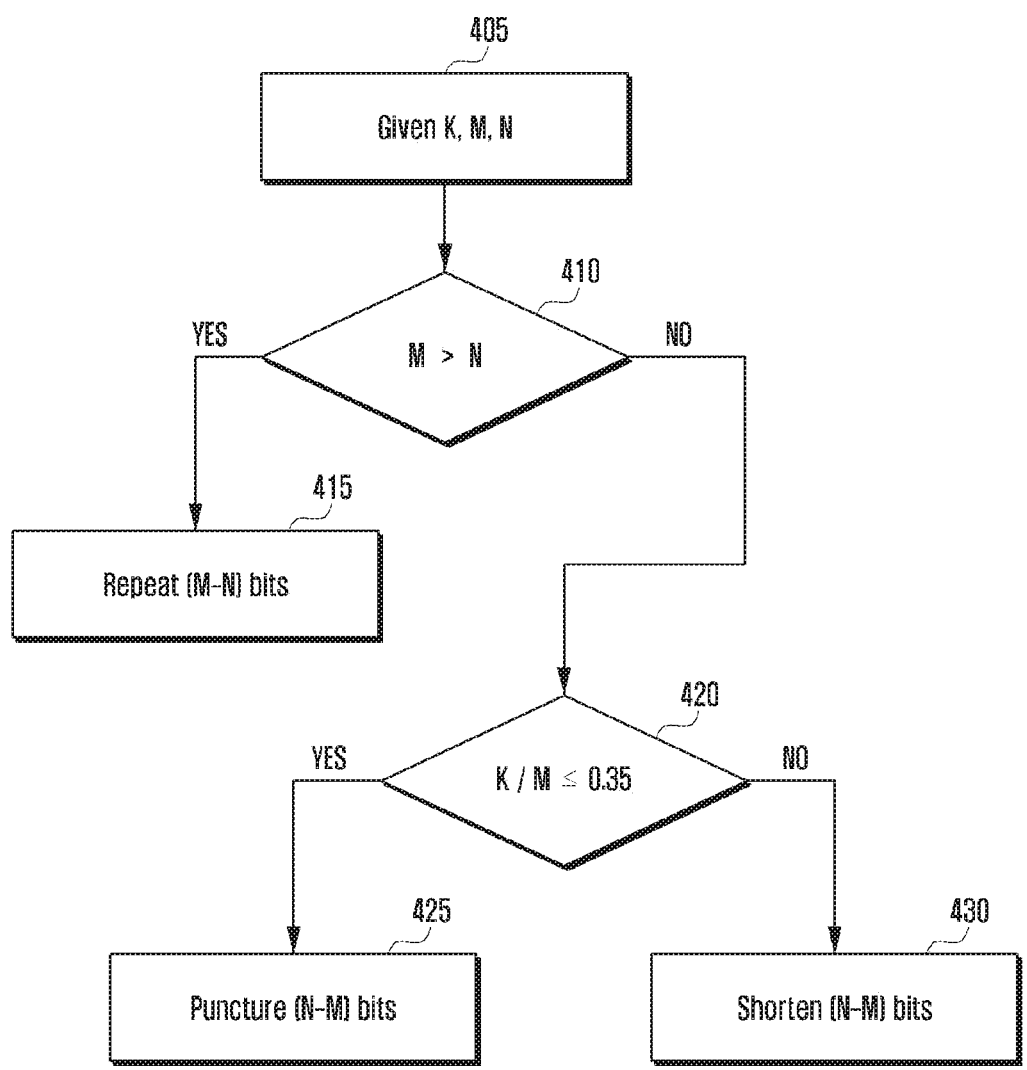
FIG. 4 is a diagram illustrating a process and criteria for selecting one of puncturing, shortening, and repetition for polar code rate-matching according to an embodiment of the disclosure.

FIG. 4 shows a process of determining which operation among puncturing, shortening, and repetition operations will be performed, based on the above parameters K and M and the mother code size N obtained through the above process according to an embodiment of the disclosure.

Referring to FIG. 4, based on K, M, and N, it is possible to determine which operation among puncturing, shortening, and repetition will be used to transmit data.

At operation 405, the length K of bits to be transmitted and the length M of codeword bits to be transmitted through a channel are given.

At operation 410, it may be determined whether M is greater than N.

If M is greater than N, it is determined at operation 415 to repeat M−N bits after encoding. In this case, because all bits generated by encoding are transmitted, there is no sub-channel forcibly frozen by puncturing. Thus, a related calculation process may be omitted.

On the other hand, if M is smaller than M, the puncturing or shortening operation will be performed.

At operation 420, it may be determined whether a code rate K/M is equal to or lower than a predetermined reference code rate $R_c$.

If the code rate K/M is equal to or lower than the predetermined reference code rate $R_c$, it is determined at operation 425 to puncture N−M bits of a resultant encoded x-bit vector.

If the code rate K/M is greater than the predetermined reference code rate $R_c$, it is determined at operation 430 to shorten the N−M bits of the resultant encoded x-bit vector. In one embodiment of the disclosure, the reference code rate $R_c$ for determining puncturing and shortening may be 0.35 in consideration of performance, and this value may vary according to various embodiments.

As described hereinbefore, if M is smaller than N, it is possible to determine whether to perform shortening or puncturing, based on the code rate.

Figure 5:
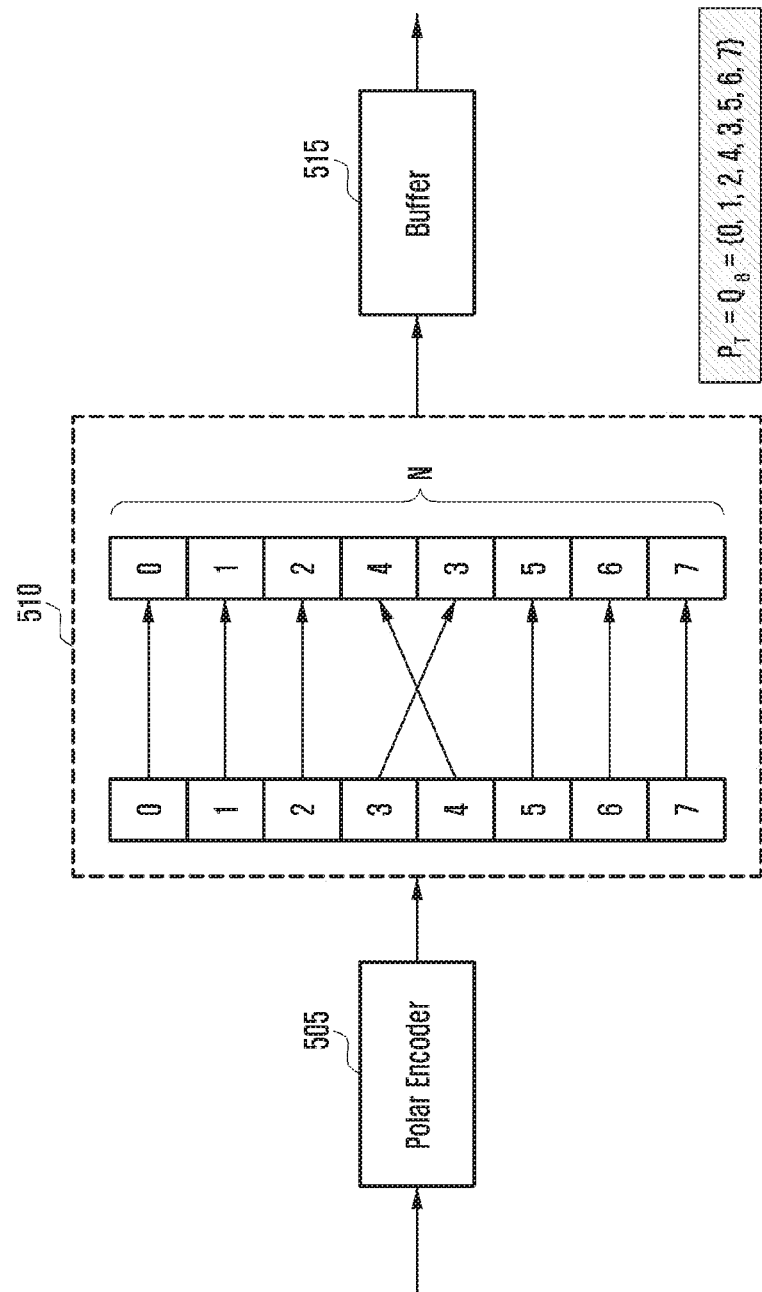
FIG. 5 is a diagram illustrating an interleaver operation based on a sub-block permutation in the order of an 8-sized small polar code sequence according to an embodiment of the disclosure.
Figure 6:
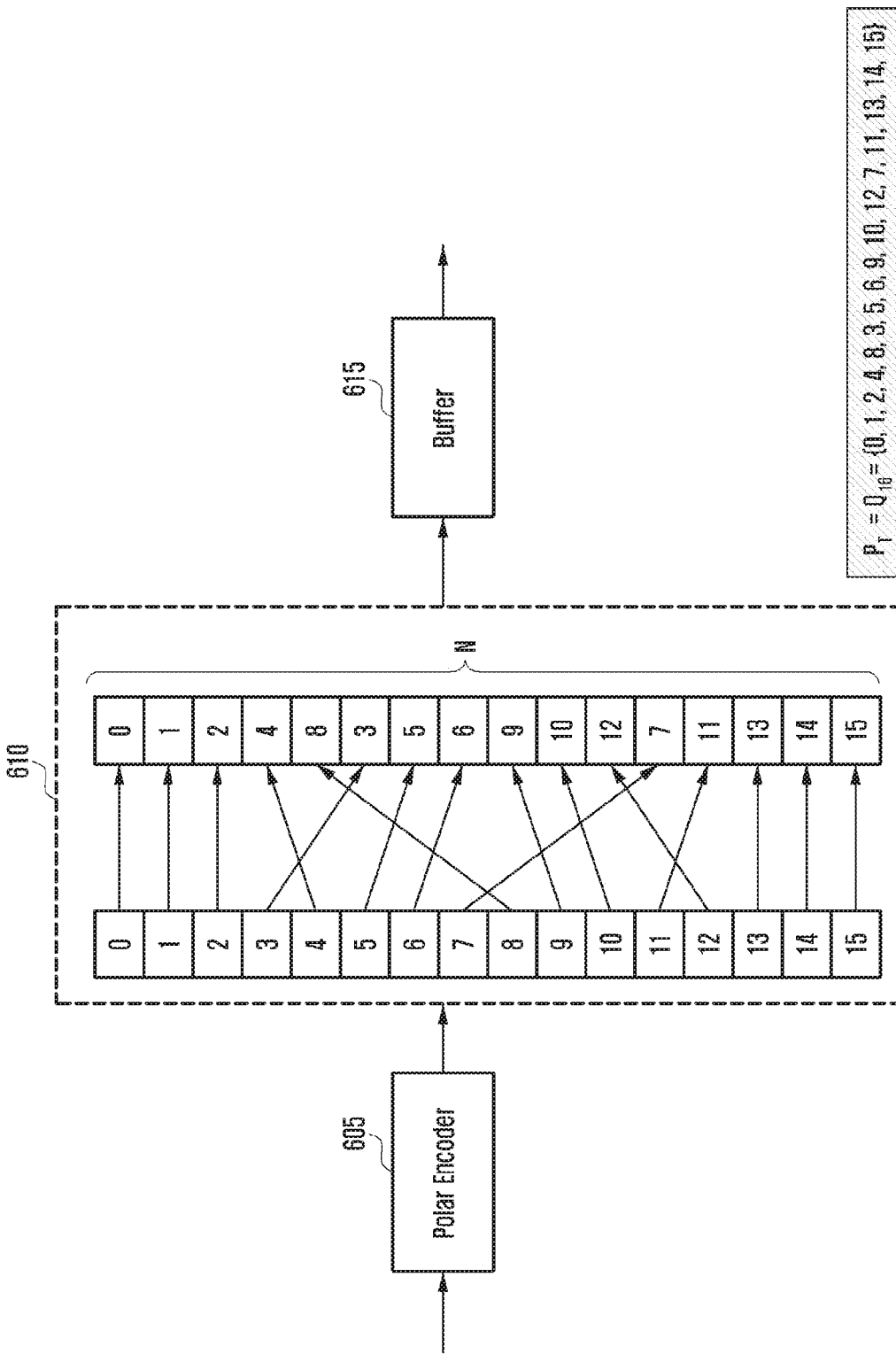
FIG. 6 is a diagram illustrating an interleaver operation based on sub-block permutation in the order of a 16-sized small polar code sequence according to an embodiment of the disclosure.

FIGS. 5 and 6 are diagrams illustrating an interleaver operation based on a sub-block permutation for rate-matching according to an embodiment of the disclosure.

Referring to FIGS. 5 and 6, shown is an interleaver operation based on a sub-block permutation for rate-matching according to various embodiments of the disclosure.

An x vector obtained through encoding with a polar code having a mother code of size N at operation 505 is divided into T sub-blocks at operation 510, and then interleaving is performed based on the sub-blocks. Herein, T is a power of 2, which is smaller than N, and is a relatively small value. Usually, T is determined as 8, 16, or 32, and may be set to a larger value. Thus, each sub-block contains N/T bits. Respective sub-blocks are interleaved in a predetermined order (i.e., interleaver pattern) $P_T$. In one embodiment of the disclosure, part or all of $P_T$ complies with the order of a short-length polar code sequence. The polar code sequences $Q_8$, $Q_{16}$, and $Q_{32}$ having sizes of 8, 16, and 32 have a determined form regardless of a channel SNR, and are given by the following Equations.

$$Q_8 = \{0, 1, 2, 4, 3, 5, 6, 7\} \quad \text{Equation 3}$$

$$Q_{16} = \{0, 1, 2, 4, 8, 3, 5, 6, 9, 10, 12, 7, 11, 13, 14, 15\} \quad \text{Equation 4}$$

$$Q_{32} = \{0, 1, 2, 4, 8, 16, 3, 5, 6, 9, 10, 17, 12, 18, 20, 24, 7, 11, 13, 19, 14, 21, 22, 25, 26, 28, 15, 23, 27, 29, 30, 31\} \quad \text{Equation 5}$$

At operation 510, the bit sequence that results from polar encoding is interleaved in units of sub-blocks by using an interleaver determined as $P_T = Q_8 = \{0, 1, 2, 4, 3, 5, 6, 7\}$. This result is stored in a buffer at operation 515.

An x vector obtained through encoding with a polar code having a mother code of size N at operation 605 is divided into T sub-blocks at operation 610, and then interleaving is performed based on the sub-blocks. Specifically, at operation 610, the bit sequence that results from polar encoding is interleaved in units of sub-blocks by using an interleaver determined as $P_T = Q_{16} = \{0, 1, 2, 4, 8, 3, 5, 6, 9, 10, 12, 7, 11, 13, 14, 15\}$. This result is stored in a buffer at operation 615.

In various embodiments, $P_T$ that indicates an interleaver pattern is not necessarily equal to the short-length polar code sequence $Q_T$. However, in one embodiment of the disclosure, it may be considered to comply with at least a partial order of $Q_T$ for excellent performance. For example, in order to determine $P_{16}$, the order of front eight elements of $Q_{16}$ is used, and the order of back eight elements complies with the ascending order of numbers. As a result, $P_{16}$ is determined as $P_{16} = \{0, 1, 2, 4, 8, 3, 5, 6, 7, 9, 10, 11, 12, 13, 14, 15\}$. This sequence is simply exemplary (and not limited thereto), and the form of a sub-block permutation is not necessarily limited to a specific form.

Figure 7:
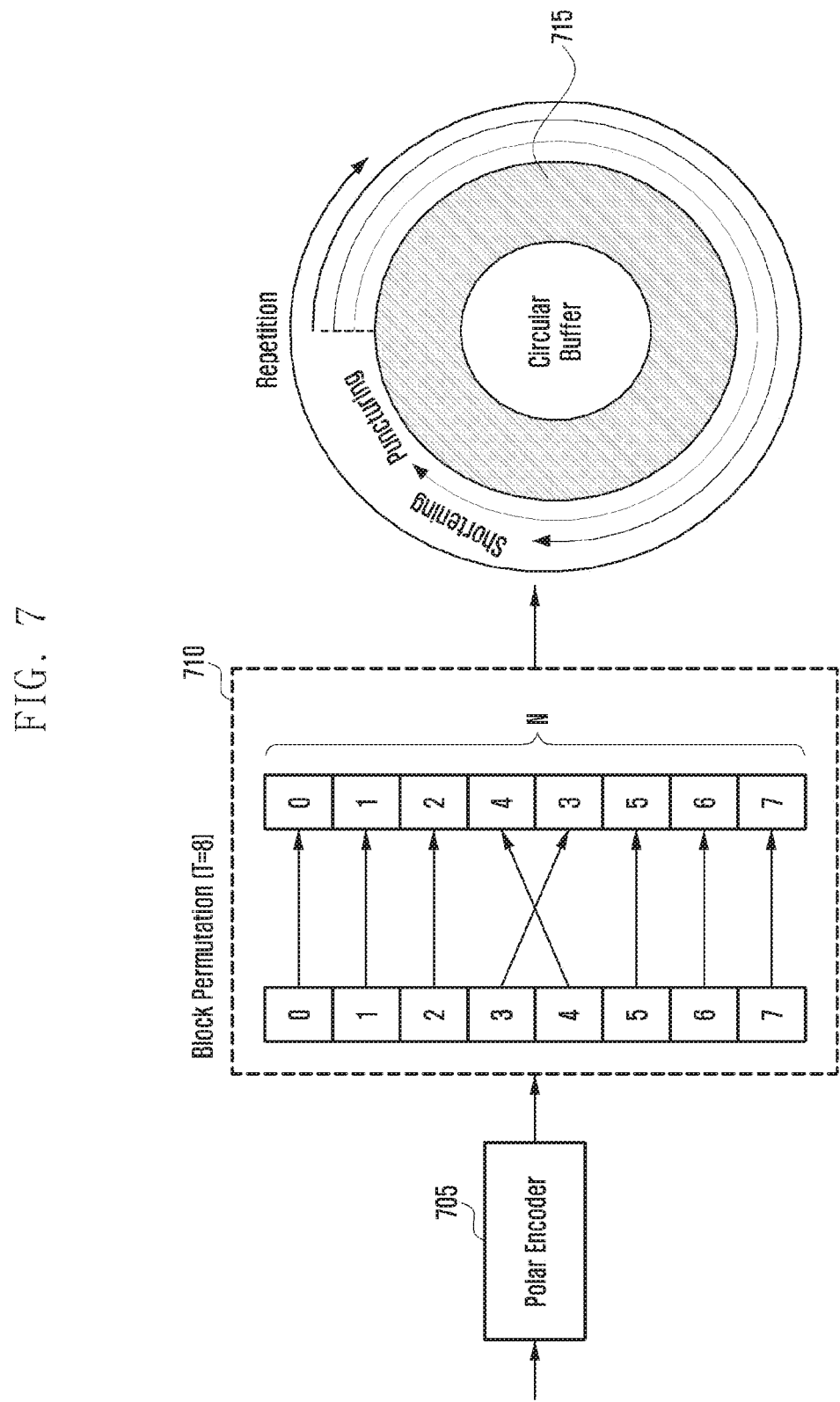
FIG. 7 is a diagram illustrating a process of storing a bit sequence, obtained by performing an interleaver operation based on a sub-block permutation, in a buffer and loading bits from the buffer according to an embodiment of the disclosure.

FIG. 7 illustrates a process in which a bit sequence resulting from encoding is interleaved based on a block permutation of $P_8$, is stored in a buffer, and is then loaded for rate-matching according to an embodiment of the disclosure.

Referring to FIG. 7, disclosed is a technical feature of an embodiment in which polar-coded bits are interleaved and then stored in a buffer in consideration of rate-matching. Although for simplicity it is assumed that an interleaver based on a sub-block permutation of $P_8$ is used as an example, any other sequence may be used.

An x vector obtained through encoding with a polar code having a mother code of size N at operation 705 is divided into T sub-blocks at operation 710, and then interleaving is performed based on the sub-blocks. At operation 715, the bit sequence interleaved in units of sub-blocks is stored in a buffer, and then M bits are loaded from the buffer and delivered to a process such as a channel interleaver or a modulator. In various embodiments of the disclosure, the operation of a circular buffer used in a general communication system is considered as shown in FIG. 7. The following embodiments relate to the operation of the circular buffer regarding repetition, puncturing, and shortening.

Figure 8:
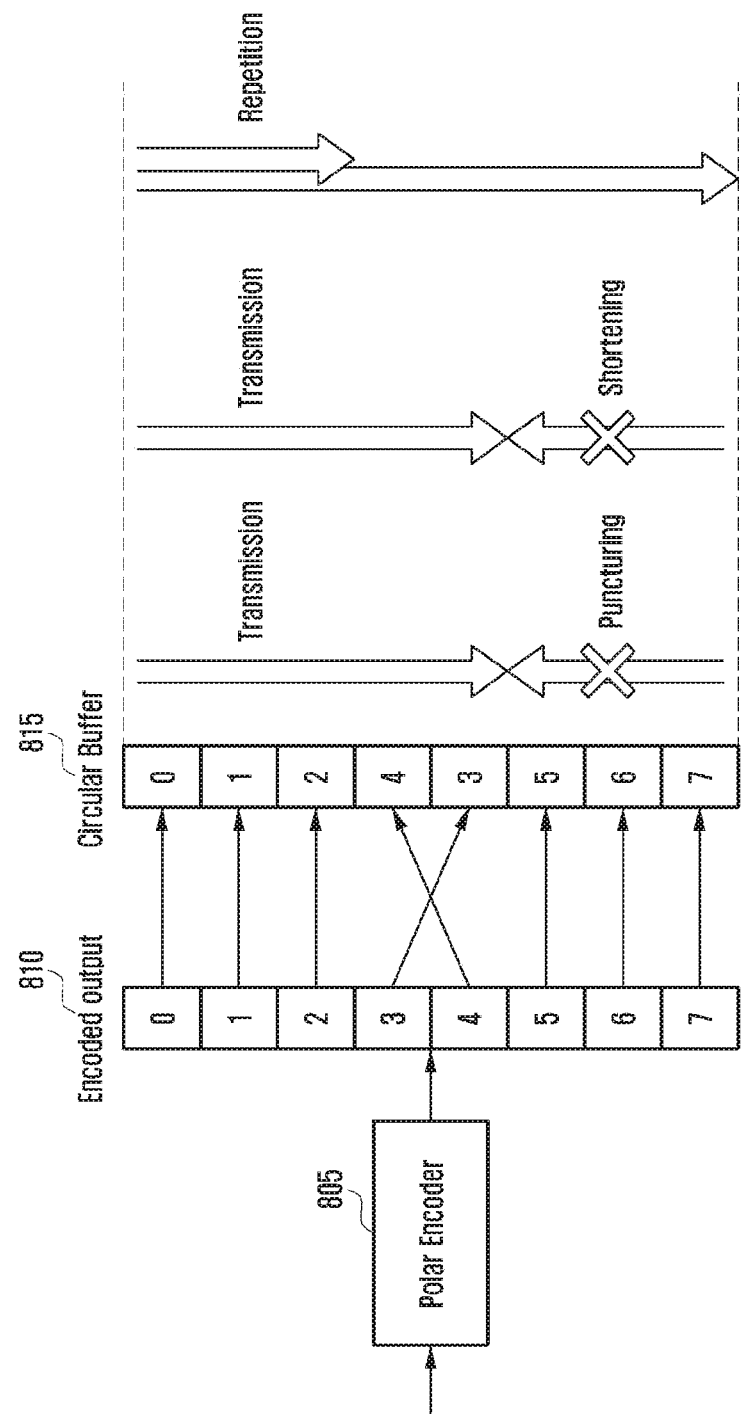
FIG. 8 is a diagram illustrating the order of extracting bits stored in a circular buffer after an interleaver operation based on a block permutation according to the first embodiment of the disclosure.

FIG. 8 is a diagram illustrating the order of extracting bits stored in a circular buffer after an interleaver operation based on a block permutation according to the first embodiment of the disclosure.

Referring to FIG. 8, shown is a method of loading and extracting interleaved bit sequence from the circular buffer.

An x vector obtained through encoding with a polar code having a mother code of size N at operation 805 is divided into T sub-blocks at operation 810, and then interleaving is performed based on the sub-blocks. At operation 815, bits stored in the circular buffer may be loaded sequentially regardless of puncturing, shortening, and repetition operations. That is, bits in the 0th sub-block are sequentially loaded first, and then bits in the first sub-block are sequentially loaded. Such bits are not loaded in units of sub-blocks. Therefore, in case of puncturing or shortening, the N−M bits stored in the latter portion of the buffer are punctured or shortened. Also, in case of repetition, the M−N bits stored in the former portion of the buffer are repeated.

Figure 9:
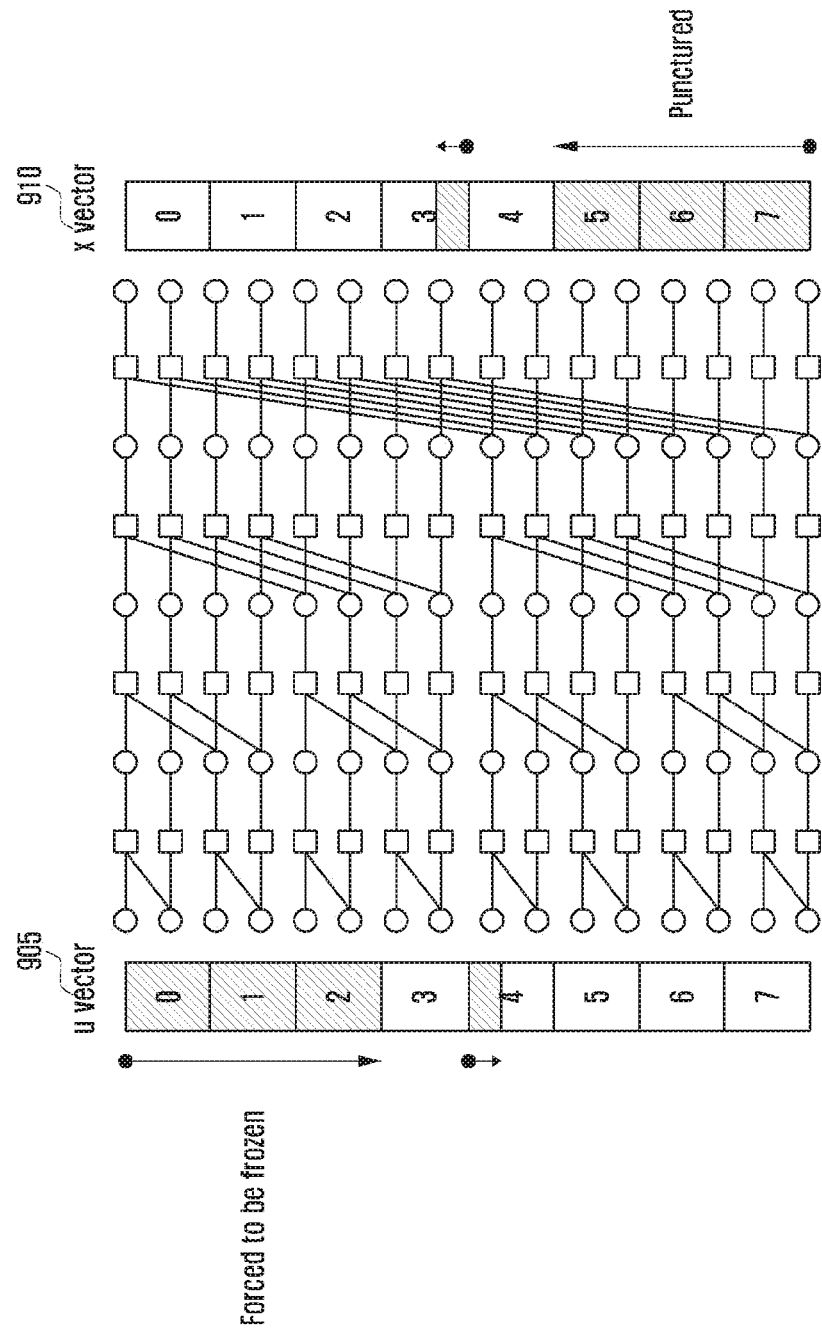
FIG. 9 is a diagram illustrating a process of determining a forcedly frozen sub-channel in an encoding process when puncturing occurs by a rate-matching operation for extracting bits after an interleaver operation based on a block permutation according to the first embodiment of the disclosure.

FIG. 9 is a diagram illustrating a process of determining a forcedly frozen sub-channel in an encoding process when puncturing occurs by a rate-matching operation for extracting bits after an interleaver operation based on a block permutation according to the first embodiment of the disclosure.

Referring to FIG. 9, shown is a method for determining a frozen sub-channel in an encoding process in order to perform puncturing.

In case of puncturing, N−M bits stored in the latter portion of the buffer are punctured at operation 910. Because the bits stored in the buffer are interleaved by the sub-block permutation, the punctured bits in an encoding graph of the polar code are interleaved in a pattern as defined by a reverse process of the interleaving. In case of extracting bits according to the first embodiment, sub-channels are forcedly frozen in the reverse order of puncturing pattern in the encoding end at operation 905. That is, if the back ten bits of the seventh sub-block are punctured at operation 910, the sub-channels for the front ten bits of the 0th sub-block are forcedly frozen at operation 905. This is related to the duality of the puncturing pattern, and if the puncturing pattern is well designed, it is possible to be forcedly frozen in the reverse order of puncturing. Encoding is performed by substituting a value such as zero, promised by the transmitter and the receiver, for a forcedly frozen position.

Figure 10:
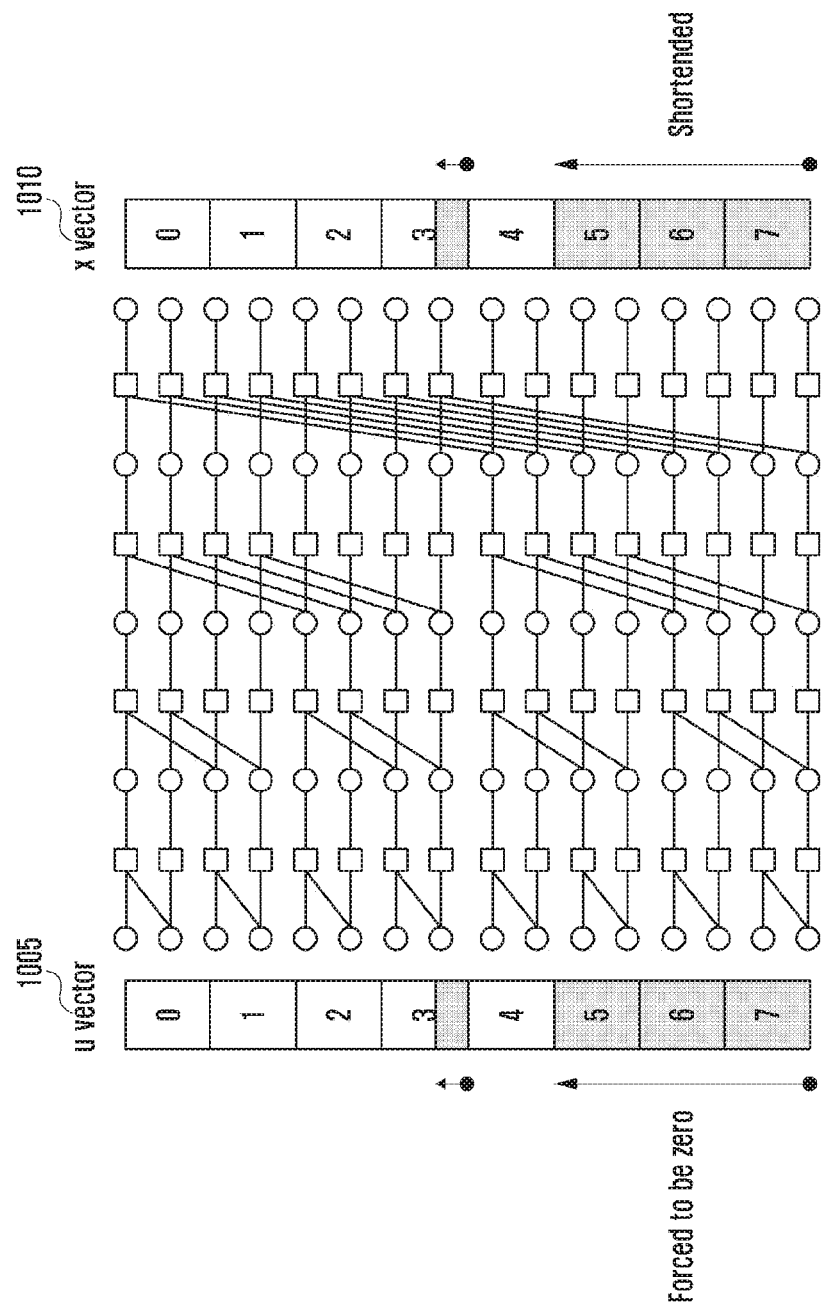
FIG. 10 is a diagram illustrating a process of determining a forcedly frozen sub-channel in an encoding process when shortening occurs by a rate-matching operation for extracting bits after an interleaver operation based on a block permutation according to the first embodiment of the disclosure.

FIG. 10 is a diagram illustrating a process of determining a forcedly frozen sub-channel in an encoding process when shortening occurs by a rate-matching operation for extracting bits after an interleaver operation based on a block permutation according to the first embodiment of the disclosure.

Referring to FIG. 10, shown is a method for determining a frozen sub-channel in an encoding process in order to perform shortening.

In case of shortening, N−M bits stored in the latter portion of the buffer are shortened at operation 1010. Because the bits stored in the buffer are interleaved by the sub-block permutation, the shortened bits in an encoding graph of the polar code are interleaved in a pattern as defined by a reverse process of the interleaving. In case of extracting bits according to the first embodiment, sub-channels are forcedly frozen in the same order of shortening pattern in the encoding end at operation 1005. Encoding is performed by substituting a value, promised by the transmitter and the receiver, for a forcedly frozen position. This promised value may be, but not limited to, zero in an embodiment.

Figure 11:
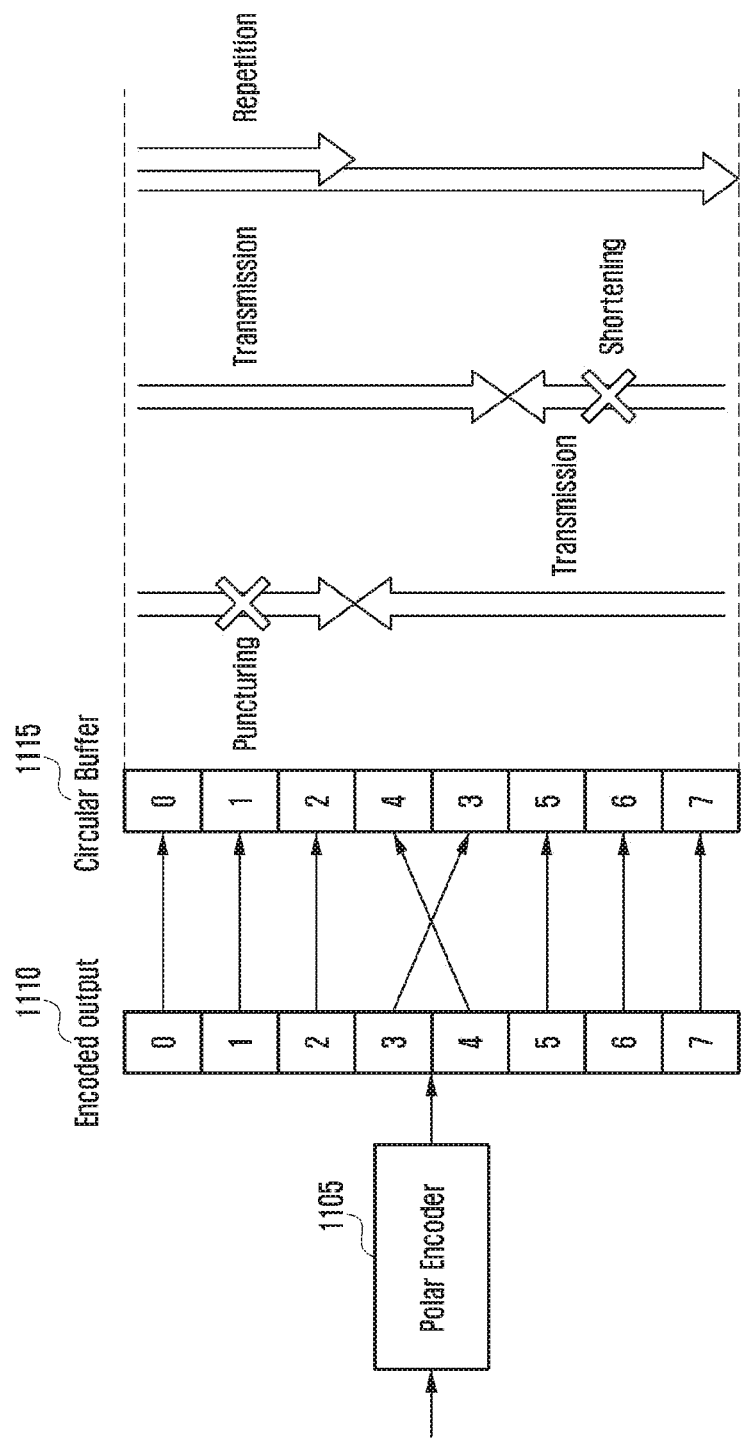
FIG. 11 is a diagram illustrating the order of extracting bits stored in a circular buffer after an interleaver operation based on a block permutation according to the second embodiment of the disclosure.

FIG. 11 is a diagram illustrating the order of extracting bits stored in a circular buffer after an interleaver operation based on a block permutation according to the second embodiment of the disclosure.

Referring to FIG. 11, shown is a method of loading and extracting interleaved bit sequence from the circular buffer.

An x vector obtained by encoding into a polar code having a mother code of size N determined at operation 1105 is divided into T sub-blocks at operation 1110, and then interleaving is performed based on the sub-blocks. At operation 1115, bits stored in the circular buffer may be loaded sequentially in the forward direction in case of a shortening or repetition operation and loaded sequentially in the reverse direction in case of a puncturing operation. That is, in case of shortening or repetition, bits in the 0th sub-block are sequentially loaded first, and then bits in the first sub-block are sequentially loaded. On the other hand, in case of puncturing, bits in the seventh sub-block are reversely loaded first, and then bits in the sixth sub-block are reversely loaded. Such bits are not loaded in units of sub-blocks. Therefore, in case of shortening, the N−M bits stored in the latter portion of the buffer are shortened. Also, in case of puncturing, the N−M bits stored in the former portion of the buffer are punctured. And also, in case of repetition, the M−N bits stored in the former portion of the buffer are repeated. The determination of sub-channels forcedly frozen at the encoding end by the shortening follows the above-described embodiment of FIG. 10.

Figure 12:
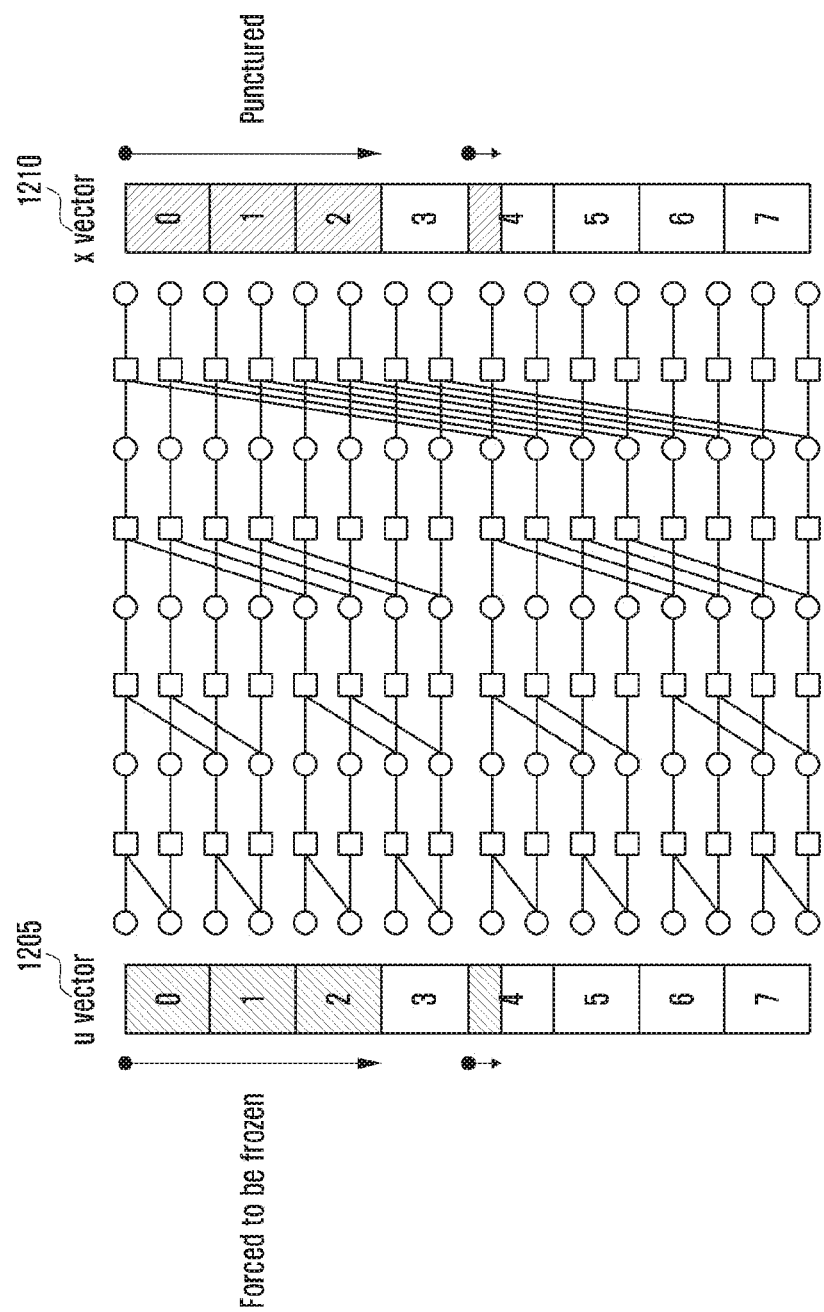
FIG. 12 is a diagram illustrating a process of determining a forcedly frozen sub-channel in an encoding process when puncturing occurs by a rate-matching operation for extracting bits after an interleaver operation based on a block permutation according to the second embodiment of the disclosure.

FIG. 12 is a diagram illustrating a process of determining a forcedly frozen sub-channel in an encoding process when puncturing occurs by a rate-matching operation for extracting bits after an interleaver operation based on a block permutation according to the second embodiment of the disclosure.

Referring to FIG. 12, shown is a method for determining a frozen sub-channel in an encoding process in order to perform puncturing.

In case of puncturing, N−M bits stored in the former portion of the buffer are punctured at operation 1210. Because the bits stored in the buffer are interleaved by the sub-block permutation, the punctured bits in an encoding graph of the polar code are interleaved in a pattern as defined by a reverse process of the interleaving. In case of extracting bits according to the second embodiment, sub-channels are forcedly frozen in the reverse order of puncturing pattern in the encoding end at operation 1205. Encoding is performed by substituting a value, promised by the transmitter and the receiver, for a forcedly frozen position.

Figure 13:
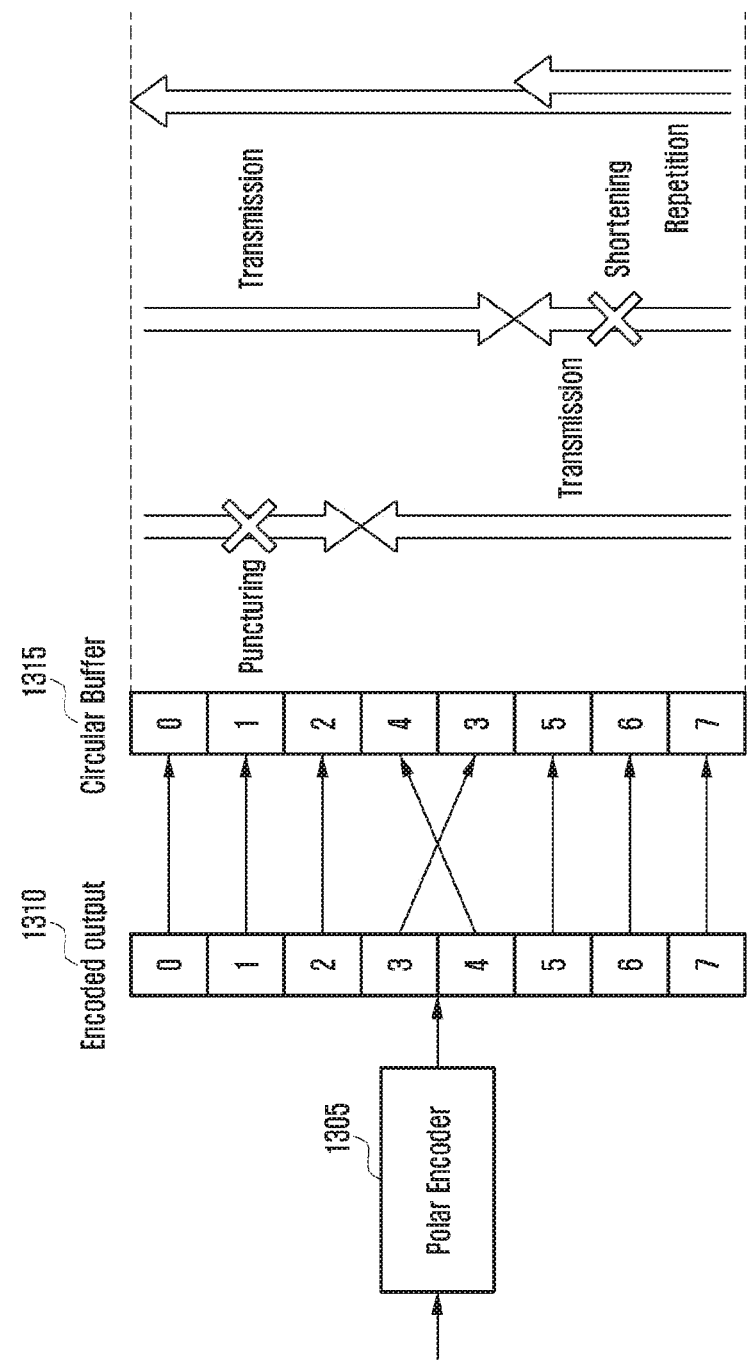
FIG. 13 is a diagram illustrating the order of extracting bits stored in a circular buffer after an interleaver operation based on a block permutation according to the third embodiment of the disclosure.

FIG. 13 is a diagram illustrating the order of extracting bits stored in a circular buffer after an interleaver operation based on a block permutation according to the third embodiment of the disclosure.

Referring to FIG. 13, shown is a method of loading and extracting interleaved bit sequence from the circular buffer.

An x vector obtained by encoding into a polar code having a mother code of size N determined at operation 1305 is divided into T sub-blocks at operation 1310, and then interleaving is performed based on the sub-blocks. At operation 1315, bits stored in the circular buffer may be loaded sequentially in the forward direction in case of a shortening operation and loaded sequentially in the reverse direction in case of a puncturing or repetition operation. That is, in case of shortening, bits in the 0th sub-block are sequentially loaded first, and then bits in the first sub-block are sequentially loaded. On the other hand, in case of puncturing or repetition, bits in the seventh sub-block are reversely loaded first, and then bits in the sixth sub-block are reversely loaded. Such bits are not loaded in units of sub-blocks. Therefore, in case of shortening, the N−M bits stored in the latter portion of the buffer are shortened. Also, in case of puncturing, the N−M bits stored in the former portion of the buffer are punctured. And also, in case of repetition, the M−N bits stored in the latter portion of the buffer are repeated. The determination of sub-channels forcedly frozen at the encoding end by the puncturing follows the above-described embodiment of FIG. 12, and the determination of sub-channels forcedly frozen at the encoding end by the shortening follows the above-described embodiment of FIG. 10.

Figure 14:
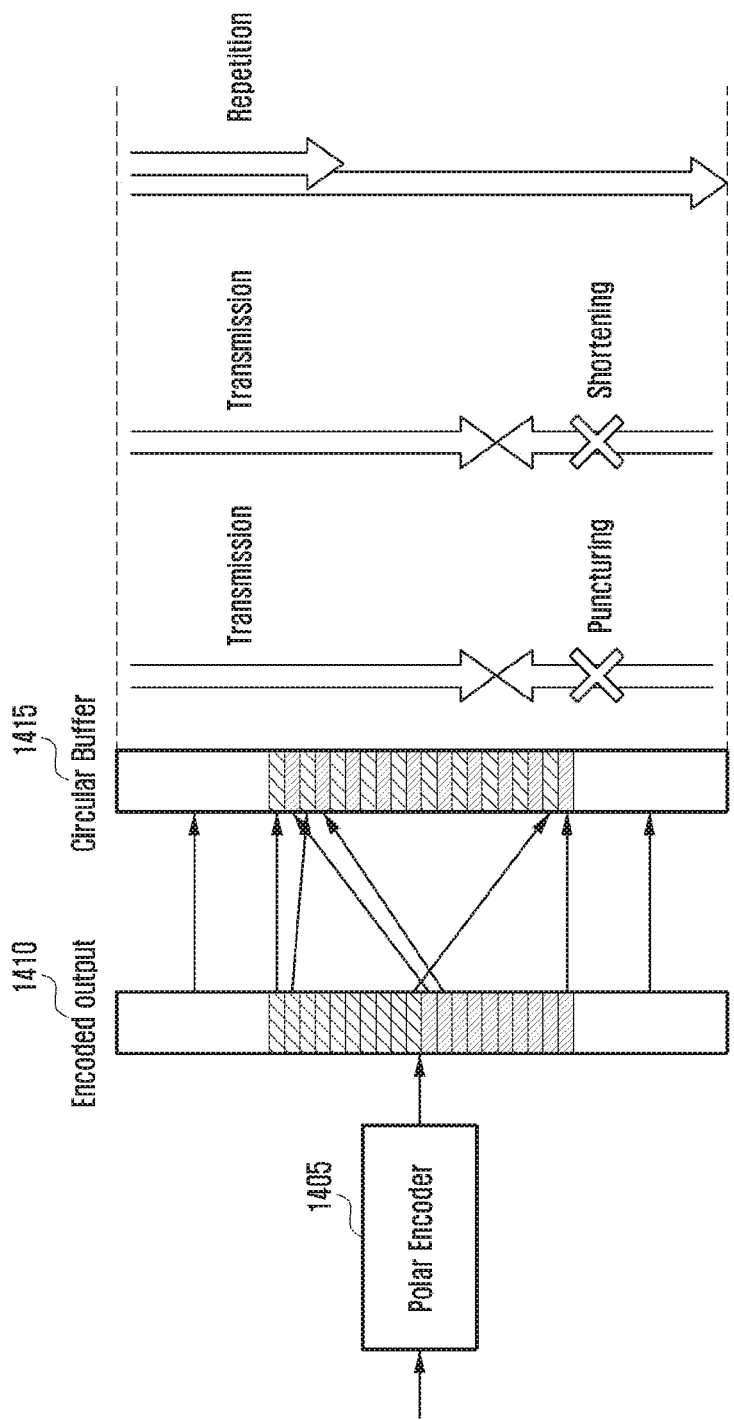
FIG. 14 is a diagram illustrating the order of extracting bits stored in a circular buffer after a cross-based interleaver operation according to the fourth embodiment of the disclosure.

FIG. 14 is a diagram illustrating the order of extracting bits stored in a circular buffer after a cross-based interleaver operation according to the fourth embodiment of the disclosure.

Referring to FIG. 14, shown is the order of bits stored in the buffer after the operation of the cross-based interleaver.

An output bit sequence encoded into a polar code at operation 1405 is divided into four sub-blocks {0, 1, 2, 3 } in the cross-based interleaver at operation 1410. Then, at operation 1415, bits of the sub-blocks 1 and 2 are interleaved. For such an interleaving scheme, a method of extracting bits from a buffer as shown in FIG. 13 has been used. Considered in an embodiment of the disclosure is a method of loading bits sequentially and equally regardless of puncturing, shortening, and repetition even after the cross-based interleaver operation. This is a transmission method using a duality relationship between a sub-channel forcedly frozen at the encoding input and a bit punctured at the encoding output. By loading the bits equally, it is possible to realize the same buffer management.

Figure 15:
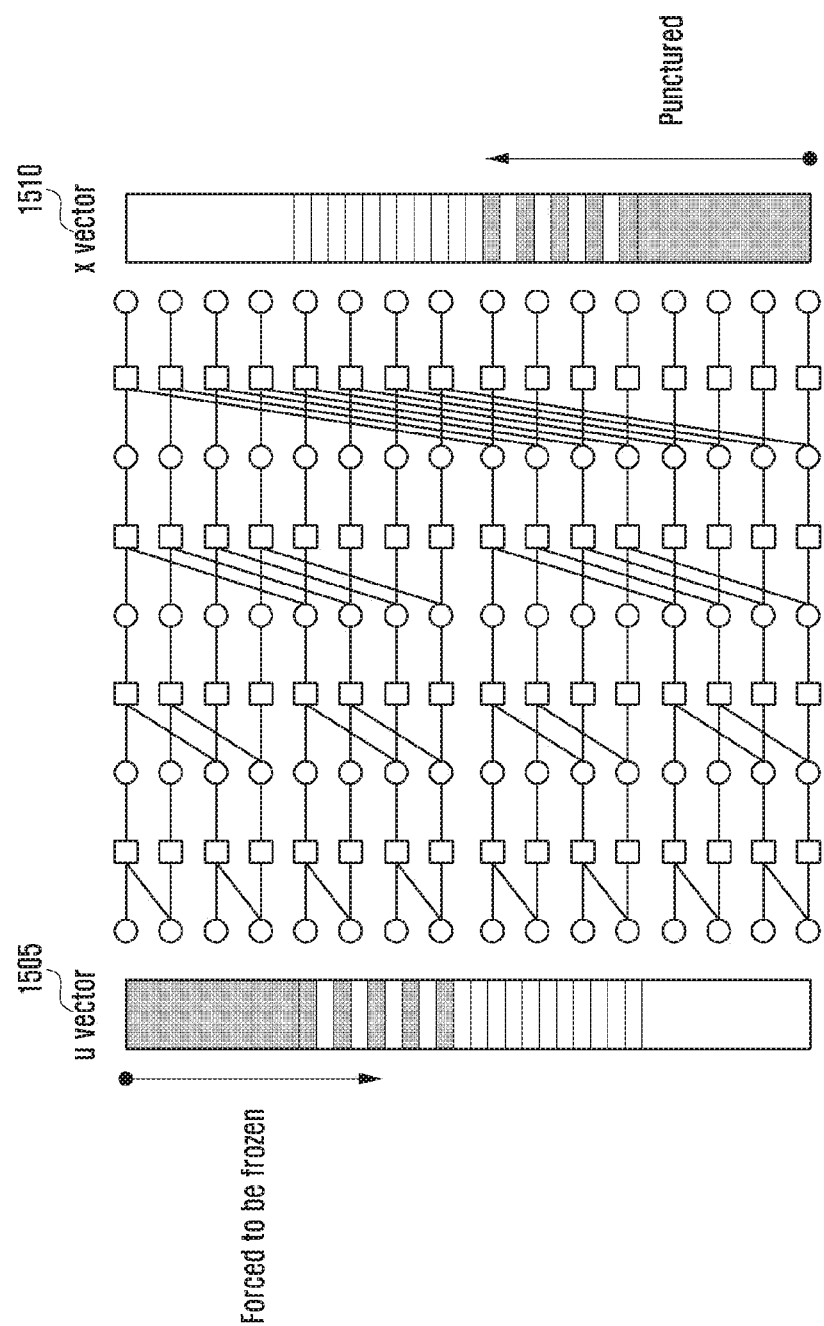
FIG. 15 is a diagram illustrating a process of determining a forcedly frozen sub-channel in an encoding process when puncturing occurs by a rate-matching operation for extracting bits after an interleaver operation based on a block permutation according to the fourth embodiment of the disclosure.

FIG. 15 is a diagram illustrating a process of determining a forcedly frozen sub-channel in an encoding process when puncturing occurs by a rate-matching operation for extracting bits after an interleaver operation based on a block permutation according to the fourth embodiment of the disclosure.

Referring to FIG. 15, shown is a method for determining a frozen sub-channel in an encoding process to perform puncturing. As described above, forcedly frozen sub-channels are determined in the reverse order of the puncturing pattern in this embodiment as well. In case of puncturing, N−M bits stored in the former portion of the buffer may be punctured at operation 1510, and in case of extracting bits according to the second embodiment, sub-channels may forcedly be frozen in an order of puncturing pattern in the encoding end at operation 1505.

Meanwhile, in this embodiment, the size and number of sub-blocks used in the interleaver operation based on a block permutation may be varied depending on the size of a mother code. Embodiments of determining the number of sub-blocks used for respective sizes of the mother code are as follows.

1) Method for determining the number of sub-blocks used for respective mother code sizes while fixing the size of sub-block: For example, if the size of sub-block used in the interleaver based on the block permutation is fixed to 8, the number of sub-blocks used when the size of the mother code is 64, 128, 256, 512, or 1024 is determined as 8, 16, 32, 64, or 128. Similarly, if the size of sub-block is 16, the number of sub-blocks is determined as 4, 8, 16, 32, or 64 in case where the mother code size is 64, 128, 256, 512, or 1024. In case of other sub-block sizes, the number of sub-blocks may be determined in the same way. This method may be advantageous in hardware implementation because the size of sub-block is kept constant even if the mother code size is changed.

2) Method for independently determining the number of sub-blocks used for respective mother code sizes: Considering performance and implementation complexity for each mother code size, the optimal number of sub-blocks is determined. In this case, the number of sub-blocks used when the mother code size is 256 is not related to the number of sub-blocks used when the mother code size is 512. The number of sub-blocks may be determined by performing the optimization operation on each mother code size.

3) Method for maintaining the number of sub-blocks used for respective mother code sizes: Even if the mother code size varies to 64, 128, 256, 512, 1024, or the like, the number of sub-blocks used in the interleaver is maintained uniformly.

In addition, the interleaving order $P_T$ of sub-blocks in the interleaver operation may be determined as follows.

1) Method for determining $P_T$ according to the number of sub-blocks used: $P_T$ is used differently according to the number of sub-blocks determined in block permutation operation. In this case, $P_T$ may be determined by performing the performance optimization for each given number of sub-blocks.

2) Method for determining $P_T$ according to the size of a mother code: $P_T$ is used differently according to the size of a mother code used. In this case, $P_T$ may be determined by performing the performance optimization for each given size of a mother code.

The interleaving order $P_T$ is characterized by satisfying a partial order condition. Herein, the partial order is one of features of a polar code sequence considered in a polar code design, and is a condition that indicates the order of reliability (or the order of channel status or the order of sub-channel error rate) between sub-channels of the polar code regardless of a physical channel environment. In order to maintain the relationship between rate-matching and frozen described in FIGS. 12 and 15, the interleaving order $P_T$ is selected from orders satisfying the partial order.

In the embodiment, the partial order is a relation between two integers. In the binary representation of two integers a and b, a set of positions where 1 exists is a subset a may be greater than or equal to b, and it may be determined based on the binary representation of each sub-block index as described with reference to the above embodiment. For example, a small index may be located in the front of the sequence.

One of the above embodiments is as follows. The following is simply exemplary (and not limited thereto), and the number of sub-blocks and the interleaving order, used per mother code, may be determined based on at least one of the above-described methods.

1. When the mother code size is 64
Number of Sub-blocks: 4

$P_T = \{0, 1, 2, 3\}$

2. When the mother code size is 128
Number of Sub-blocks: 8

$P_T = \{0, 1, 2, 4, 3, 5, 6, 7\}$

3. When the mother code size is 256
Number of Sub-blocks: 16

$P_T = \{0, 1, 2, 4, 8, 3, 5, 6, 9, 10, 12, 7, 11, 13, 14, 15\}$

4. When the mother code size is 512
Number of Sub-blocks: 32

$P_T = \{0, 1, 2, 4, 8, 16, 3, 5, 6, 9, 10, 17, 12, 18, 20, 24, 7, 11, 21, 22, 25, 26, 28, 15, 23, 27, 29, 30, 31\}$

One embodiment of the interleaving order $P_T$ described above is as follows. When the number of sub-blocks is A, the interleaving order $P_T$ may be expressed in three parts as follows:

$P_T\{P_{T1}, P_{T2}, P_{T3}\}$

Here, $P_{T1}$ is a sequence having a length of $A_1$, and is generated by arranging natural numbers from 0 to $A_1-1$ in a form satisfying the partial order. For example, if $A_1$ is 8, one example of $P_{T1}$ is $\{0, 1, 2, 4, 3, 5, 6, 7\}$. Also, $P_{T3}$ is a sequence having a length of $A_1$, and is generated by arranging natural numbers from $A-A_1$ to $A-1$ in a form satisfying the partial order. For example, if A is 32 and $A_1$ is 8, one example of $P_{T3}$ is $\{24, 25, 26, 28, 27, 29, 30, 31\}$.

In addition, $P_{T2}$ whose length $A_2$ is $A-2A_1$ is constructed by interlacing natural numbers from $A_1$ to $A-A_1-1$, as follows.

$$P_{T2} = \left\{A_1, \frac{A}{2}, A_1+1, \frac{A}{2}+1, A_1+2, \frac{A}{2}+2, \ldots, A-A_1-1\right\}$$

For example, when A is 32 and $A_1$ is 8, $P_{T2}$ is determined as follows:
{8, 16, 9, 17, 10, 18, 11, 19, 12, 20, 13, 21, 14, 22, 15, 23}.

Also, when A is 32 and $A_1$ is 8, one example of the interleaving order $P_T$ is as follows:
$P_T$={0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31}.

As a possible representation of the interleaving order $P_T$, it is possible to add a certain natural number to all numbers in the above-described $P_T$. For example, $P_T$ may start at 1 rather than 0. Also, the order of notation may be reversed.

Representative examples of $P_T$s satisfying the partial order are as follows:

Example 1) A=32, $A_1$=8

$P_T$={0,1,2,3,4,5,6,7,8,16,9,17,10,18,11,19,12,20,13, 21,14,22,15,23,24,25,26,27,28,29,30,31}

$P_T$={0,1,2,3,4,5,6,7,8,16,9,17,10,18,11,19,12,20,13, 21,14,22,15,23,24,25,26,28,27,29,30,31}

$P_T$={0,1,2,4,3,5,6,7,8,16,9,17,10,18,11,19,12,20,13, 21,14,22,15,23,24,25,26,27,28,29,30,31}

$P_T$={0,1,2,4,3,5,6,7,8,16,9,17,10,18,11,19,12,20,13, 21,14,22,15,23,24,25,26,28,27,29,30,31}

Example 2) A=32, $A_1$=10

$P_T$={0,1,2,4,8,3,5,9,6,7,10,16,11,17,12,18,13,19,14, 20,15,21,24,25,22,26,28,23,27,29,30,31}

$P_T$={0,1,2,4,8,3,5,6,9,7,10,16,11,17,12,18,13,19,14, 20,15,21,24,22,25,26,28,23,27,29,30,31}

$P_T$={0,1,2,4,8,3,5,6,7,9,10,16,11,17,12,18,13,19,14, 20,15,21,22,24,25,26,28,23,27,29,30,31}

$P_T$={0,1,2,4,3,8,5,9,6,7,10,16,11,17,12,18,13,19,14, 20,15,21,24,25,22,26,28,23,27,29,30,31}

$P_T$={0,1,2,4,3,8,5,6,9,7,10,16,11,17,12,18,13,19,14, 20,15,21,24,22,25,26,28,23,27,29,30,31}

$P_T$={0,1,2,4,3,8,5,6,7,9,10,16,11,17,12,18,13,19,14, 20,15,21,22,24,25,26,28,23,27,29,30,31}

$P_T$={0,1,2,4,3,5,8,9,6,7,10,16,11,17,12,18,13,19,14, 20,15,21,24,25,22,23,26,28,27,29,30,31}

$P_T$={0,1,2,4,3,5,8,6,9,7,10,16,11,17,12,18,13,19,14, 20,15,21,24,22,25,23,26,28,27,29,30,31}

$P_T$={0,1,2,4,3,5,8,6,7,9,10,16,11,17,12,18,13,19,14, 20,15,21,22,24,25,23,26,28,27,29,30,31}

$P_T$={0,1,2,4,3,5,6,8,9,7,10,16,11,17,12,18,13,19,14, 20,15,21,24,22,23,25,26,28,27,29,30,31}

$P_T$={0,1,2,4,3,5,6,8,7,9,10,16,11,17,12,18,13,19,14, 20,15,21,22,24,23,25,26,28,27,29,30,31}

$P_T$={0,1,2,4,3,5,6,7,8,9,10,16,11,17,12,18,13,19,14, 20,15,21,22,23,24,25,26,28,27,29,30,31}

$P_T$={0,1,2,3,4,8,5,9,6,7,10,16,11,17,12,18,13,19,14, 20,15,21,24,25,22,26,23,27,28,29,30,31}

$P_T$={0,1,2,3,4,8,5,6,9,7,10,16,11,17,12,18,13,19,14, 20,15,21,24,22,25,26,23,27,28,29,30,31}

$P_T$={0,1,2,3,4,8,5,6,7,9,10,16,11,17,12,18,13,19,14, 20,15,21,22,24,25,26,23,27,28,29,30,31}

$P_T$={0,1,2,3,4,5,8,9,6,7,10,16,11,17,12,18,13,19,14, 20,15,21,24,25,22,23,26,27,28,29,30,31}

$P_T$={0,1,2,3,4,5,8,6,9,7,10,16,11,17,12,18,13,19,14, 20,15,21,24,22,25,23,26,27,28,29,30,31}

$P_T$={0,1,2,3,4,5,8,6,7,10,16,11,17,12,18,13,19,14, 20,15,21,24,22,25,23,26,27,28,29,30,31}

$P_T$={0,1,2,3,4,5,6,8,9,7,10,16,11,17,12,18,13,19,14, 20,15,21,22,24,25,23,26,27,28,29,30,31}

$P_T$={0,1,2,3,4,5,6,8,7,9,10,16,11,17,12,18,13,19,14, 20,15,21,22,24,23,25,26,27,28,29,30,31}

$P_T$={0,1,2,3,4,5,6,7,8,9,10,16,11,17,12,18,13,19,14, 20,15,21,22,23,24,25,26,27,28,29,30,31}

Example 3) A=32, $A_1$=12

$P_T$={0,1,2,4,8,3,5,9,6,10,7,11,12,16,13,17,14,18,15, 19,20,24,21,25,22,26,28,23,27,29,30,31}

$P_T$={0,1,2,4,8,3,5,9,6,7,10,11,12,16,13,17,14,18,15, 19,20,21,24,25,22,26,28,23,27,29,30,31}

$P_T$={0,1,2,4,8,3,5,6,9,10,7,11,12,16,13,17,14,18,15, 19,20,24,21,22,25,26,28,23,27,29,30,31}

$P_T$={0,1,2,4,8,3,5,6,9,7,10,11,12,16,13,17,14,18,15, 19,20,21,24,22,25,26,28,23,27,29,30,31}

$P_T$={0,1,2,4,8,3,5,6,7,9,10,11,12,16,13,17,14,18,15, 19,20,21,22,24,25,26,28,23,27,29,30,31}

$P_T$={0,1,2,4,3,8,5,9,6,10,7,11,12,16,13,17,14,18,15, 19,20,24,21,25,22,26,23,27,28,29,30,31}

$P_T$={0,1,2,4,3,8,5,9,6,7,10,11,12,16,13,17,14,18,15, 19,20,21,24,25,22,26,23,27,28,29,30,31}

$P_T$={0,1,2,4,3,8,5,6,9,10,7,11,12,16,13,17,14,18,15, 19,20,24,21,22,25,26,23,27,28,29,30,31}

$P_T$={0,1,2,4,3,8,5,6,9,7,10,11,12,16,13,17,14,18,15, 19,20,21,24,22,25,26,23,27,28,29,30,31}

$P_T$={0,1,2,4,3,8,5,6,7,9,10,11,12,16,13,17,14,18,15, 19,20,21,22,24,25,26,23,27,28,29,30,31}

$P_T$={0,1,2,4,3,5,8,9,6,10,7,11,12,16,13,17,14,18,15, 19,20,24,21,25,22,23,26,28,27,29,30,31}

$P_T$={0,1,2,4,3,5,8,9,6,7,10,11,12,16,13,17,14,18,15, 19,20,21,24,25,22,23,26,28,27,29,30,31}

$P_T$={0,1,2,4,3,5,8,6,9,10,7,11,12,16,13,17,14,18,15, 19,20,24,21,22,25,23,26,28,27,29,30,31}

$P_T$={0,1,2,4,3,5,8,6,9,7,10,11,12,16,13,17,14,18,15, 19,20,21,24,22,25,23,26,28,27,29,30,31}

$P_T$={0,1,2,4,3,5,8,6,7,9,10,11,12,16,13,17,14,18,15, 19,20,21,22,24,25,23,26,28,27,29,30,31}

$P_T$={0,1,2,4,3,5,6,8,9,10,7,11,12,16,13,17,14,18,15, 19,20,24,21,22,23,25,26,28,27,29,30,31}

$P_T$={0,1,2,4,3,5,6,8,9,7,10,11,12,16,13,17,14,18,15, 19,20,21,24,22,23,25,26,28,27,29,30,31}

$P_T$={0,1,2,4,3,5,6,8,7,9,10,11,12,16,13,17,14,18,15, 19,20,21,22,24,23,25,26,28,27,29,30,31}

$P_T$={0,1,2,4,3,5,6,7,8,9,10,11,12,16,13,17,14,18,15,
19,20,21,22,23,24,25,26,28,27,29,30,31}

$P_T$={0,1,2,3,4,8,5,9,6,10,7,11,12,16,13,17,14,18,15,
19,20,24,21,25,22,26,23,27,28,29,30,31}

$P_T$={0,1,2,3,4,8,5,9,6,7,10,11,12,16,13,17,14,18,15,
19,20,21,24,25,22,26,23,27,28,29,30,31}

$P_T$={0,1,2,3,4,8,5,6,9,10,7,11,12,16,13,17,14,18,15,
19,20,24,21,22,25,26,23,27,28,29,30,31}

$P_T$={0,1,2,3,4,8,5,6,9,7,10,11,12,16,13,17,14,18,15,
19,20,21,24,22,25,26,23,27,28,29,30,31}

$P_T$={0,1,2,3,4,8,5,6,7,9,10,11,12,16,13,17,14,18,15,
19,20,21,22,24,25,26,23,27,28,29,30,31}

$P_T$={0,1,2,3,4,5,8,9,6,10,7,11,12,16,13,17,14,18,15,
19,20,24,21,25,22,23,26,27,28,29,30,31}

$P_T$={0,1,2,3,4,5,8,9,6,7,10,11,12,16,13,17,14,18,15,
19,20,21,24,25,22,23,26,27,28,29,30,31}

$P_T$={0,1,2,3,4,5,8,6,9,10,7,11,12,16,13,17,14,18,15,
19,20,24,21,22,25,23,26,27,28,29,30,31}

$P_T$={0,1,2,3,4,5,8,6,9,7,10,11,12,16,13,17,14,18,15,
19,20,21,24,22,25,23,26,27,28,29,30,31}

$P_T$={0,1,2,3,4,5,8,6,7,9,10,11,12,16,13,17,14,18,15,
19,20,21,22,24,25,23,26,27,28,29,30,31}

$P_T$={0,1,2,3,4,5,6,8,9,10,7,11,12,16,13,17,14,18,15,
19,20,24,21,22,23,25,26,27,28,29,30,31}

$P_T$={0,1,2,3,4,5,6,8,9,7,10,11,12,16,13,17,14,18,15,
19,20,21,24,22,23,25,26,27,28,29,30,31}

$P_T$={0,1,2,3,4,5,6,8,7,9,10,11,12,16,13,17,14,18,15,
19,20,21,22,24,23,25,26,27,28,29,30,31}

$P_T$={0,1,2,3,4,5,6,7,8,9,10,11,12,16,13,17,14,18,15,
19,20,21,22,23,24,25,26,27,28,29,30,31}

Figure 16:
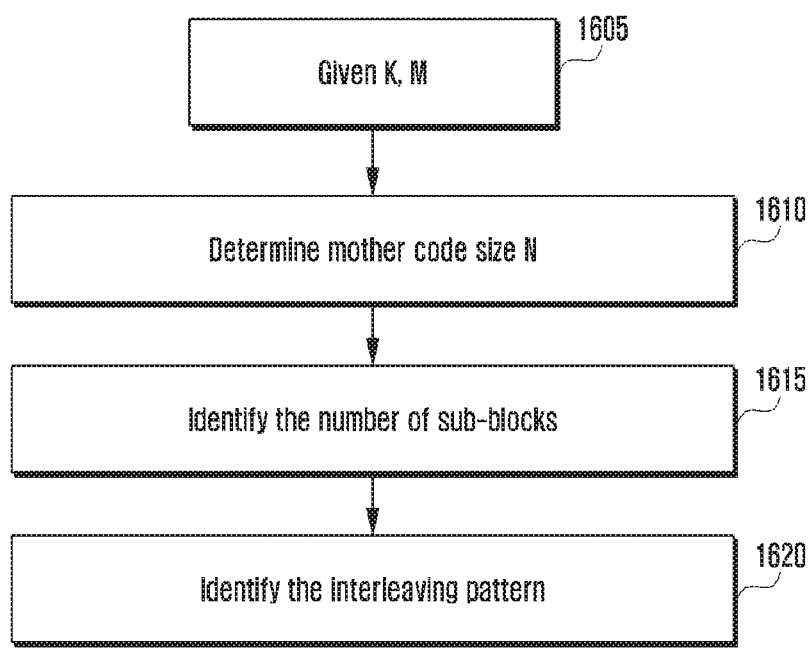
FIG. 16 is a flow diagram illustrating a detailed process of determining the interleaving described in FIG. 2 according to an embodiment of the disclosure.

FIG. 16 is a diagram illustrating a part of the above-described transmitter operation according to an embodiment of the disclosure.

Referring to FIG. 16, shown is a detailed process of determining the interleaving described in FIG. 2 and the like.

The interleaver operation based on a block permutation may be used in combination with the following additional operations.

First, at operation 1605, the length K of bits to be transmitted and the length M of codeword bits to be transmitted through a channel are given.

At operation 1610, based on the above parameters K and M, the transmitter determines the size N of a mother code to be used for polar encoding.

At operation 1615, the transmitter may determine the size of sub-blocks according to the size of the mother code. Determining the sub-block size may use one of methods described in various embodiments of the disclosure.

At operation 1620, the transmitter may identify an interleaving pattern for the sub-block. In addition, a method of performing the interleaving may include one of the following operations.

[Operation 1] Sub-channel allocation adjustment may be performed. Specifically, for transmission of information bits, sub-channel allocation is performed generally according to a polar code sequence. The sub-channel allocation adjustment includes a sub-channel allocation operation in consideration of a rate-matching operation. In detail, by reflecting a variation in a mutual information or an error probability of sub-channel in the rate-matching operation of puncturing, shortening, or repetition, an operation of adjusting the order of sub-channels to which information bits are allocated may be included. This means that consideration is given to the influence on the remaining sub-channels in addition to the incapable sub-channel generated by the above-described rate-matching operation. One method for simplifying the sub-channel allocation adjustment is to divide all sub-channels of the polar codes into two parts, based on indexes, and to adjust the number of information bits allocated to each part by considering puncturing, shortening, and repetition.

[Operation 2] Bit permutation in sub-block: This means a bit permutation operation of mixing bits included in a sub-block in addition to the above-described block permutation operation considered by the disclosure. When mixing bits in a sub-block, all sub-blocks may be mixed in the same pattern or different patterns.

Figure 17:
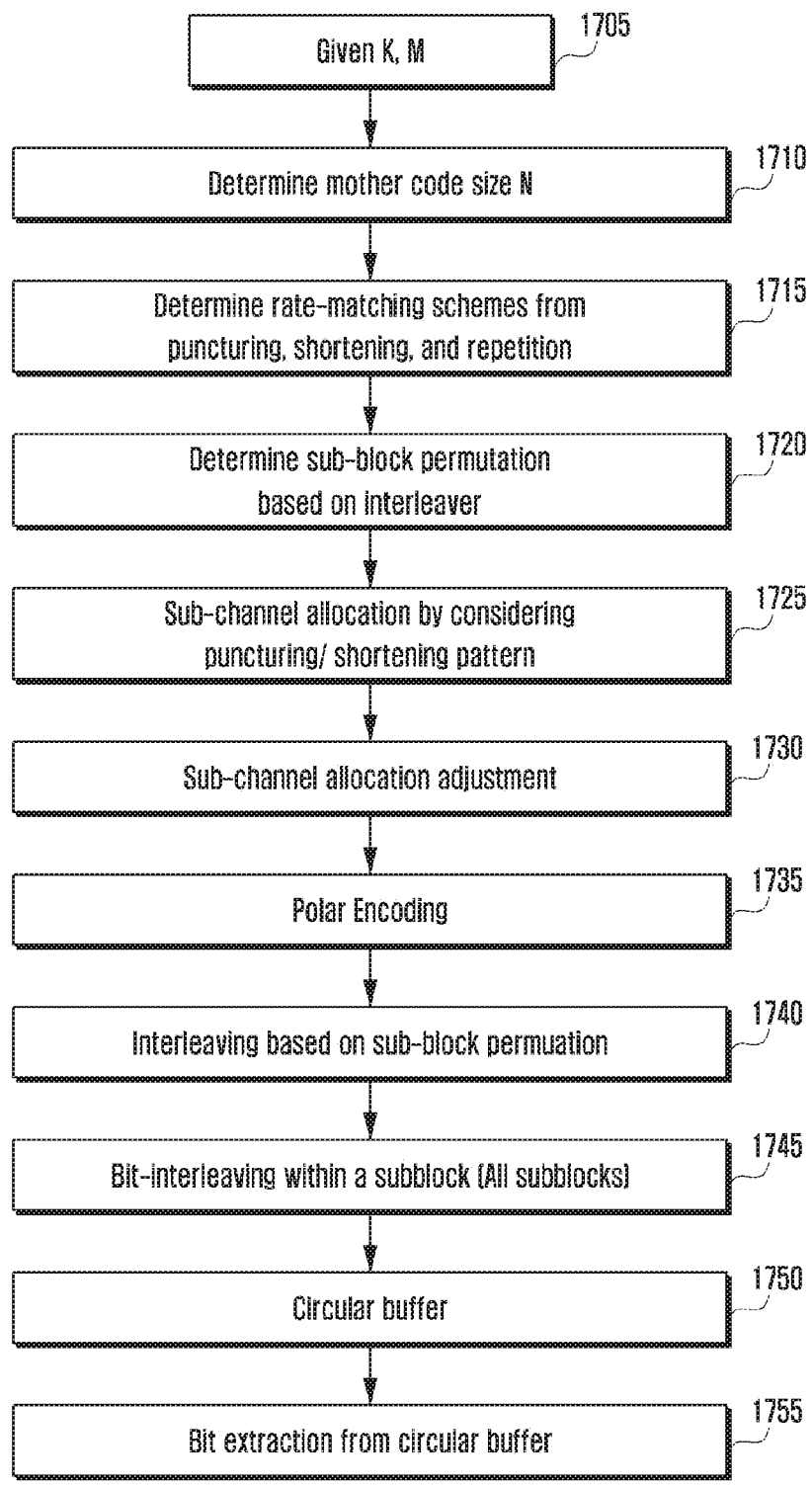
FIG. 17 is a flow diagram illustrating a process in case where an interleaver based on a block permutation is used together with a sub-channel allocation adjustment operation or a permutation operation in a sub-block according to an embodiment of the disclosure.

FIG. 17 is a flow diagram illustrating an encoding and rate-matching process including the sub-channel allocation adjustment operation and the bit permutation operation in the sub-block as described above according to an embodiment of the disclosure.

Referring to FIG. 17, disclosed is the operation of a transmitter considering rate-matching according to an embodiment of the disclosure.

First, at operation 1705, the length K of bits to be transmitted and the length M of codeword bits to be transmitted through a channel are given.

At operation 1710, the transmitter determines the size N of a mother code to be used for polar encoding.

At operation 1715, based on the above parameters N, K, and M, and a predetermined criterion, the transmitter determines which rate-matching operation from among puncturing, shortening, and repetition will be performed.

If it is determined to perform the puncturing or shortening operation, the transmitter determines at operation 1720 a sub-channel incapable of being selected for transmission of information from among sub-channels as described above. At this time, the sub-channel incapable of being selected is determined in consideration of interleaving and rate-matching operations to be performed subsequently. Specifically, in an embodiment, all bits may be divided into sub-blocks in consideration of the puncturing or shortening operation, and this may be performed in consideration of the interleaving operation.

At operation 1725, the transmitter performs a sub-channel allocation for information bits to be transmitted.

At operation 1730, the transmitter may perform sub-channel allocation adjustment.

At operation 1735, the transmitter may perform polar encoding.

At operation 1740, based on a predetermined scheme, the transmitter interleaves a bit sequence obtained as a result of the encoding.

At operation 1745, the transmitter may interleave bits within a sub-block.

At operation 1750, the transmitter stores the interleaved bit sequence in a buffer.

At operation 1755, the transmitter loads, from this buffer, M bits to be transmitted through a channel. Thereafter, these bits are transmitted through the channel after channel interleaving, modulation, and the like are performed.

Depending on various embodiments, the sub-channel allocation adjustment of operation 1730 and the bit-interleaving within a sub-block of operation 1745 may be selectively performed or omitted.

Figure 18:
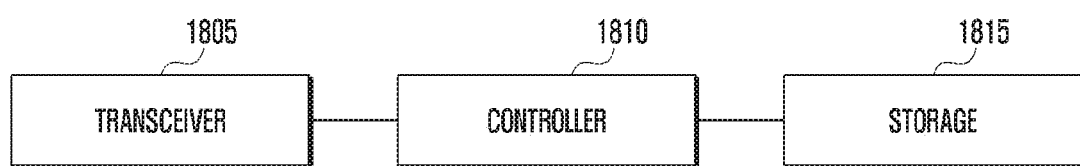
FIG. 18 is a block diagram illustrating a transmitter apparatus according to an embodiment of the disclosure.

FIG. 18 is a block diagram illustrating a transmitter according to an embodiment of the disclosure.

Referring to FIG. 18, the transmitter may include a transceiver 1805, a controller 1810, and a storage 1815. In the disclosure, the controller 1810 may be defined as a circuit, an application-specific integrated circuit (ASIC), or at least one processor.

The transceiver 1805 may transmit and receive signals with other devices. When the transmitter is implemented in a terminal, the transceiver 1805 may receive, for example, system information and a synchronization signal or reference signal from a base station, and also transmit a bit sequence to the base station.

The controller 1810 may control the overall operations of the transmitter according to various embodiments of the disclosure. For example, the controller 1810 may control a signal flow between respective blocks to perform the above-described operations. Specifically, the controller 1810 may control the transmitter to encode the information bits as described above in various embodiments.

The storage 1815 may store at least one of information transmitted or received through the transceiver 1805 and information generated through the controller 1810.

Figure 19:
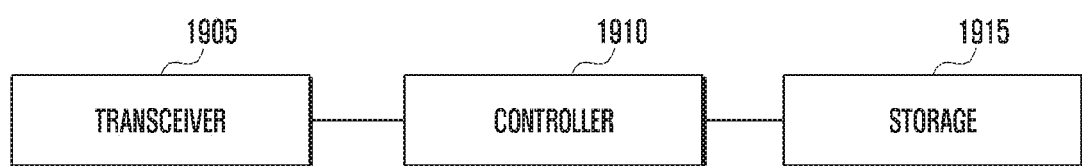
FIG. 19 is a block diagram illustrating a receiver apparatus according to an embodiment of the disclosure.

FIG. 19 is a block diagram illustrating a receiver according to an embodiment of the disclosure.

Referring to FIG. 19, the receiver may include a transceiver 1905, a controller 1910, and a storage 1915. In the disclosure, the controller 1910 may be defined as a circuit, an application-specific integrated circuit (ASIC), or at least one processor.

The transceiver 1905 may transmit and receive signals with other devices. When the receiver is implemented in a terminal, the transceiver 1905 may receive, for example, an encoded bit sequence from a base station.

The controller 1910 may control the overall operations of the receiver according to various embodiments of the disclosure. For example, the controller 1910 may control a signal flow between respective blocks to perform the above-described operations. Specifically, the controller 1910 may control the receiver to decode the encoded information bits as described above in various embodiments.

The storage 1915 may store at least one of information transmitted or received through the transceiver 1905 and information generated through the controller 1910.

According an embodiment of the disclosure, an encoding and rate-matching method for a communication system based on polar codes may include operations of: determining a size of a mother code to be used for encoding and decoding the polar codes according to a codeword bit number and a code rate; identifying a polar code sequence indicating priorities of sub-channels when information bits are allocated to the sub-channels; determining one of puncturing, shortening, and repetition operations according to the codeword bit number, the code rate, and the determined mother code size; determining an interleaver based on a block permutation for rate-matching according to the mother code size; determining a position of a part of frozen bits by puncturing/shortening based on the interleaver; encoding bits according to the determined frozen bit pattern and the polar code sequence or reliability of a polarized channel; interleaving the encoded bits by using the determined interleaver; and determining a transmission order of the interleaved bits, based on the determined one of the shortening, puncturing, and repetition operations.

The interleaver based on the block permutation may be determined in consideration of only the size of the mother code regardless of the puncturing, shortening, and repetition operations. In addition, the interleaver based on the block permutation may be determined based on the number of sub-blocks and an interleaving order of the sub-blocks. The interleaving order may be interleaving the sub-blocks in the order of a polar code sequence having the same length as the number of sub-blocks or in an arbitrary order satisfying a partial order. In case of shortening, a pattern of bits forcedly frozen among input bits of the encoding may be the same as a pattern of shortened bits among output bits of the encoding. In case of puncturing, a pattern of bits forcedly frozen among input bits of the encoding may be the same as or have a reverse order from a pattern of punctured bits among output bits of the encoding. The transmission order of the interleaved bits may be determined differently depending on the puncturing, shortening, and repetition operations, or determined equally regardless of the puncturing, shortening, and repetition operations.

The number of sub-blocks of the interleaver based on the block permutation may be determined according to the size of the mother code while fixing the size of the sub-block, determined according to the size of each mother code, or determined as a constant number regardless of the size of the mother code. In the sub-block permutation, the interleaving order may be determined according to the number of sub-blocks or the size of the mother code. The interleaver based on the block permutation may perform a sub-block permutation operation only or together with at least one of sub-channel allocation adjustment operation and a bit-interleaving operation within a sub-block.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method performed by a transmitter in a communication system, the method comprising:
   identifying a first bit sequence to be encoded;
   identifying a second bit sequence by encoding the first bit sequence with a polar code; and
   identifying a third bit sequence by performing an interleaving on the second bit sequence based on a interleaving pattern,
   wherein the interleaving pattern corresponds to {0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31}.

2. The method of claim 1, further comprising:
   identifying a rate matching output sequence by performing a rate matching on the third bit sequence.

3. The method of claim 1,
   wherein the third bit sequence includes a plurality of subblocks, of the second bit sequence, which are rearranged based on the interleaving pattern, and
   wherein a number of the plurality of subblocks is 32.

4. The method of claim 1, wherein the interleaving pattern is determined based on a partial order.

5. The method of claim 1, wherein the second bit sequence includes one or more bit, to be rated matched, set as 0.

6. The method of claim 2, wherein the performing the rate matching comprises:

determining one of a repetition or a puncturing or a shortening to be performed as the rate matching based on a length of the first bit sequence, a length of the second bit sequence, and a length of the rate matching output sequence.

7. The method of claim 6,
wherein in case that the length of the rate matching output sequence is shorter than the length of the second bit sequence, one of the puncturing or the shortening is determined to be performed based on a code rate which is determined based on the length of the first bit sequence and the length of the rate matching output sequence, and
wherein in case that the length of the rate matching output sequence is longer than the length of the second bit sequence, the repetition is determined to be performed.

8. The method of claim 2,
wherein the identifying the rate matching output sequence comprises:
  storing the third bit sequence in a circular buffer; and
  performing a puncturing of a former portion of bits in the third bit sequence, and
wherein a length of the former portion of the bits is determined by subtracting a length of the rate matching output sequence from a length of the second bit sequence.

9. The method of claim 2,
wherein the identifying the rate matching output sequence comprises:
  storing the third bit sequence in a circular buffer; and
  performing a shortening of a latter portion of bits of the third bit sequence, and
wherein a length of the latter portion of the bits is determined by subtracting a length of the rate matching output sequence from a length of the second bit sequence.

10. The method of claim 2,
wherein the identifying the rate matching output sequence comprises:
  storing the third bit sequence in a circular buffer; and
  performing a repetition of bits in the third bit sequence, and
wherein a length of the bits to be repeated is determined by subtracting a length of the second bit sequence from a length of the rate matching output sequence.

11. An apparatus for transmitting information using a polar code, the apparatus comprising:
a transceiver; and
at least one processor configured to:
  identify a second bit sequence by encoding a first bit sequence with the polar code, the first bit sequence comprising information to be transmitted,
  identify the second bit sequence into a plurality of sub-blocks, and
  perform an interleaving on the plurality of sub-blocks of the second bit sequence based on an interleaving pattern,
wherein a number of the plurality of sub-blocks is 32, and
wherein the interleaving pattern is {0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31}.

12. An apparatus in a communication system, the apparatus comprising:
a transceiver; and
a controller coupled with the transceiver and configured to:
  identify a first bit sequence to be encoded,
  identify a second bit sequence by encoding the first bit sequence with a polar code, and
  identify a third bit sequence by performing an interleaving on the second bit sequence based on a interleaving pattern
wherein the interleaving pattern corresponds to {0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31}.

13. The apparatus of claim 12, wherein the controller is further configured to identify a rate matching output sequence by performing a rate matching on the third bit sequence.

14. The apparatus of claim 12,
wherein the third bit sequence includes a plurality of subblocks, of the second bit sequence, which are rearranged based on the interleaving pattern, and
wherein a number of the plurality of subblocks is 32.

15. The apparatus of claim 12, wherein the interleaving pattern is determined based on a partial order.

16. The apparatus of claim 12, wherein the second bit sequence includes one or more bit, to be rated matched, set as 0.

17. The apparatus of claim 13, wherein, to perform the rate matching, the controller is further configured to:
determine one of a repetition or a puncturing or a shortening to be performed as the rate matching based on a length of the first bit sequence, a length of the second bit sequence, and a length of the rate matching output sequence.

18. The apparatus of claim 17,
wherein in case that the length of the rate matching output sequence is shorter than the length of the second bit sequence, one of the puncturing or the shortening is determined to be performed based on a code rate which is determined based on the length of the first bit sequence and the length of the rate matching output sequence, and
wherein in case that the length of the rate matching output sequence is longer than the length of the second bit sequence, the repetition is determined to be performed.

19. The apparatus of claim 13,
wherein to identify the rate matching output sequence, the controller is further configured to:
  store the third bit sequence in a circular buffer, and
  perform a puncturing of a former portion of bits in the third bit sequence, and
wherein a length of the former portion of the bits is determined by subtracting a length of the rate matching output sequence from a length of the second bit sequence.

20. The apparatus of claim 13,
wherein to identify the rate matching output sequence, the controller is further configured to:
  store the third bit sequence in a circular buffer, and
  perform a shortening of a latter portion of bits of the third bit sequence, and
wherein a length of the latter portion of the bits is determined by subtracting a length of the rate matching output sequence from a length of the second bit sequence.

21. The apparatus of claim 13,
wherein to identify the rate matching output sequence, the controller is further configured to:
  store the third bit sequence in a circular buffer, and
  perform a repetition of bits in the third bit sequence, and wherein a length of the bits to be repeated is determined by subtracting a length of the second bit sequence from a length of the rate matching output sequence.

22. A method performed by a receiver in a communication system, the method comprising:
identifying a plurality of values based on a received signal;
performing a de-rate-matching on the plurality of values;
performing a de-interleaving based on an interleaving pattern; and
performing a decoding to obtain information bits using a polar code,
wherein the interleaving pattern corresponds to {0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31}.

23. An apparatus in a communication system, the apparatus comprising:
a transceiver; and
a controller coupled with the transceiver and configured to:
identify a plurality of values based on a received signal,
perform a de-rate-matching on the plurality of values,
perform a de-interleaving based on an interleaving pattern, and
perform a decoding to obtain information bits using a polar code,
wherein the interleaving pattern corresponds to {0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31}.

* * * * *